(12) United States Patent
Schreck et al.

(10) Patent No.: US 12,170,435 B2
(45) Date of Patent: Dec. 17, 2024

(54) MANAGING LASER DIODE CAVITY THERMAL TRANSIENTS IN HAMR DISK DRIVES

(71) Applicant: Western Digital Technologies, Inc., San Jose, CA (US)

(72) Inventors: Erhard Schreck, San Jose, CA (US); Sukumar Rajauria, San Jose, CA (US); Robert Smith, Washington, DC (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 18/447,989

(22) Filed: Aug. 10, 2023

(65) Prior Publication Data

US 2024/0332893 A1    Oct. 3, 2024

Related U.S. Application Data

(60) Provisional application No. 63/492,802, filed on Mar. 29, 2023.

(51) Int. Cl.
*G11B 5/00* (2006.01)
*G11B 5/03* (2006.01)
*G11B 11/105* (2006.01)
*H01S 5/024* (2006.01)
*H01S 5/065* (2006.01)

(52) U.S. Cl.
CPC .............. *H01S 5/0651* (2013.01); *G11B 5/03* (2013.01); *H01S 5/02453* (2013.01); *G11B 2005/0021* (2013.01)

(58) Field of Classification Search
CPC ..... G11B 2005/0021; G11B 5/02; G11B 5/40; G11B 19/046; G11B 27/36; G11B 5/54; G11B 11/105
USPC .......................................................... 360/59
See application file for complete search history.

(56) References Cited

U.S. PATENT DOCUMENTS

| | | | |
|---|---|---|---|
| 9,281,659 B1 | 3/2016 | Tatah et al. | |
| 9,595,288 B1 | 3/2017 | Chu et al. | |
| 9,905,996 B2* | 2/2018 | Wessel | G11B 19/046 |
| 10,366,722 B1 | 7/2019 | Mendonsa et al. | |
| 2014/0119164 A1 | 5/2014 | Wilson et al. | |
| 2014/0334274 A1 | 11/2014 | Dakroub | |

(Continued)

OTHER PUBLICATIONS

Liang, Hongliang, "Integrated HAMR Light Delivery System via High Q Resonators", Aug. 2018, pp. 195, Publisher: Submitted in partial fulfillment of the requirements for the degree of Doctor of Philosophy in Electrical & Computer Enginering, Carnegie Mellon Uni.

*Primary Examiner* — Nabil Z Hindi
(74) *Attorney, Agent, or Firm* — Neugeboren O'Dowd PC

(57) ABSTRACT

A data storage device may include one or more disks, an actuator arm assembly comprising one or more magnetic recording heads, a laser diode positioned inside a laser diode cavity, and one or more processing devices configured to initiate a write operation, wherein initiating the write operation comprises activating a magnetic recording head corresponding to the laser diode, and applying a forward bias to the laser diode; apply a first reverse bias to the laser diode during at least one intervening event; and transition from applying the first reverse bias to the at least one laser diode to applying the forward bias to the at least one laser diode.

26 Claims, 13 Drawing Sheets

(56) References Cited

U.S. PATENT DOCUMENTS

2016/0087401 A1 3/2016 Wessel et al.
2019/0295580 A1 9/2019 Poss et al.

* cited by examiner

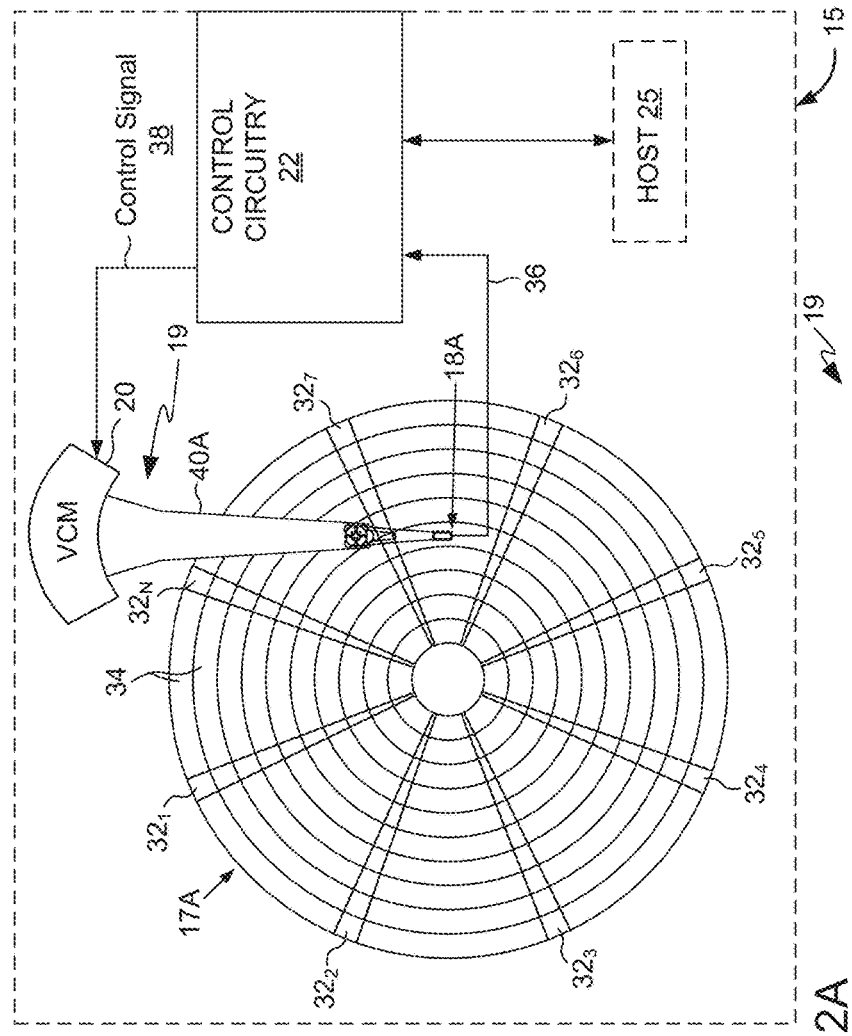
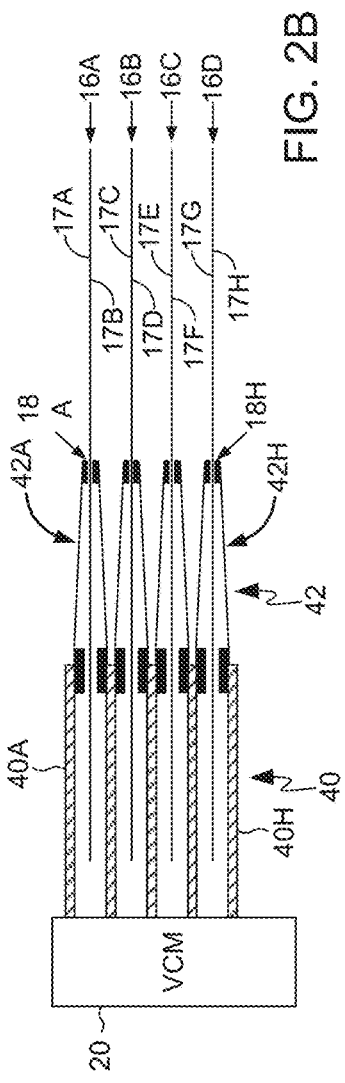

MANAGING LASER DIODE CAVITY THERMAL TRANSIENTS IN HAMR DISK DRIVES

CLAIM OF PRIORITY UNDER 35 U.S.C. § 120

The present Application for Patent claims priority to Provisional Application No. 63/492,802 entitled "MANAGING LASER DIODE CAVITY THERMAL TRANSIENTS IN HAMR DISK DRIVES" filed Mar. 29, 2023, and assigned to the assignee hereof and hereby expressly incorporated by reference herein.

BACKGROUND

Data storage devices such as disk drives comprise one or more disks, and one or more read/write heads connected to distal ends of actuator arms, which are rotated by actuators (e.g., a voice coil motor, one or more fine actuators) to position the heads radially over surfaces of the disks, at carefully controlled fly heights over the disk surfaces. The disk surfaces each comprise a plurality of radially spaced, concentric tracks for recording user data sectors and servo wedges or servo sectors. The servo tracks are written on previously blank disk drive surfaces as part of the final stage of preparation of the disk drive. The servo sectors comprise head positioning information (e.g., a track address) which is read by the heads and processed by a servo control system to control the actuator arms as they seek from track to track.

FIG. 1A shows a prior art disk format 2 as comprising a number of radially-spaced, concentric servo tracks 4 defined by servo wedges 60-6N recorded around the circumference of each servo track. A plurality of concentric data tracks are defined relative to the servo tracks 4, wherein the data tracks may have the same or a different radial density (e.g., tracks per inch (TPI)) than the servo tracks 6. Each servo wedge 6, comprises a preamble 8 for storing a periodic pattern, which allows proper gain adjustment and timing synchronization of the read signal, and a sync mark 10 for storing a special pattern used to symbol synchronize to a servo data field 12. The servo data field 12 stores coarse head positioning information, such as a servo track address, used to position the head over a target data track during a seek operation. Each servo wedge (e.g., servo wedge 64) further comprises groups of phase-based servo bursts 14 (e.g., N and Q servo bursts), which are recorded with a predetermined phase relative to one another and relative to the servo track centerlines.

The coarse head position information is processed to position a head over a target data track during a seek operation, and the servo bursts 14 provide fine head position information used for centerline tracking while accessing a data track during write/read operations. A position error signal (PES) is generated by reading the servo bursts 14, wherein the PES represents a measured position of the head relative to a centerline of a target servo track. A servo controller processes the PES to generate a control signal applied to the one or more actuators in order to actuate the head radially over the disk in a direction that reduces the PES.

The description provided in the background section should not be assumed to be prior art merely because it is mentioned in or associated with the background section. The background section may include information that describes one or more aspects of the subject technology.

SUMMARY

The following presents a summary relating to one or more aspects and/or embodiments disclosed herein. The following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

In some cases, laser diodes in Heat Assisted Magnetic Recording (HAMR) drives are susceptible to temperature-induced mode hopping, for instance, during the start of a write operation. During HAMR write, the temperature of a laser diode (LD) may increase (e.g., by 10-20 degrees C.), and several mode hop critical temperatures may be crossed during this temperature transient. In some circumstances, one or more mode hop events may be triggered during this transient phase, which may adversely impact write performance. For example, mode hop events during a HAMR write operation may result in recording non-uniformities, which degrades HAMR recording performance. Additionally, during certain drive operations (e.g., seeking between tracks, servo sector or servo wedge crossings), the LD may not be fully energized in order to keep its steady-state temperature constant. As a result, the LD temperature may drop, which causes subsequent mode hops to be more prominent.

Broadly, aspects of the present disclosure are directed to preventing or reducing mode hops by applying reverse bias (RB) power to the laser diode, for instance, during track-to-track seeks and/or servo sector crossings (or servo wedge crossings). It should be noted that RB power may be applied during other disk drive operations besides track seek and servo sector crossings, and the examples listed herein are not intended to be limiting. Additionally, or alternatively, some aspects of the present disclosure are directed to controlling laser temperature and prevent deviations from the target temperature (i.e., minimize or eliminate temperature transients) during write operations.

Thus, some aspects of the present disclosure are directed to preventing or reducing mode hops, which serves to enhance HAMR recording performance. In some embodiments, preheating a laser diode cavity to a target temperature (i.e., temperature used during the write operation) may help eliminate or minimize the temperature transient, as described in further detail below. Additionally, applying RB power (i.e., in lieu of reduced forward bias power) allows the LD temperature to be maintained at or near the steady-state temperature during certain drive operations, such as, but not limited to, track-to-track seek and servo sector or servo wedge crossings. In this way, the LD temperature may be prevented from dropping during the course of a write operation, which (1) reduces the likelihood of subsequent mode hops and/or (2) optimizes HAMR drive performance during write processes.

In some aspects, the techniques described herein relate to a data storage device, including: one or more disks; an actuator arm assembly including one or more magnetic recording heads; at least one laser diode, each of the at least one laser diode positioned inside a corresponding laser diode cavity; and one or more processing devices configured to: initiate a write operation, wherein initiating the write operation includes: activating a magnetic recording head corresponding to the at least one laser diode, and applying a forward bias to at the least one laser diode; apply a first reverse bias to the at least one laser diode during at least one intervening event; and transition from applying the first reverse bias to the at least one laser diode to applying the forward bias to the at least one laser diode.

In some aspects, the techniques described herein relate to a data storage device, wherein the at least one intervening event comprises an event selected from a group consisting of a track seek event and a servo wedge crossing event.

In some aspects, the techniques described herein relate to a data storage device, wherein the at least one intervening event comprises a plurality of intervening events, and wherein transitioning to applying the forward bias occurs with continuing the write operation, and wherein continuing the write operation includes at least one of: resuming the write operation after each of the plurality of intervening events; and resuming the write operation between adjacent intervening events of the plurality of intervening events.

In some aspects, the techniques described herein relate to a data storage device, wherein each of the at least one laser diode is positioned inside a corresponding laser diode cavity, and wherein applying the first reverse bias to the at least one laser diode during the at least one intervening event includes: controlling transition of a preamplifier from applying the forward bias to the at least one laser diode to applying the first reverse bias; and wherein a temperature of a corresponding laser diode cavity is configured to stay the same or substantially the same after controlling the transition from the forward bias to the first reverse bias for the at least one laser diode.

In some aspects, the techniques described herein relate to a data storage device, wherein each of the at least one laser diode is positioned inside a corresponding laser diode cavity, and wherein, when the first reverse bias is applied to the at least one laser diode during the at least one intervening event, the at least one laser diode is in a non-lasing state, no data writing or rewriting occurs, and a temperature of a corresponding laser diode cavity is configured to stay the same or substantially the same after the transition from the first reverse bias to the forward bias for the at least one laser diode.

In some aspects, the techniques described herein relate to a data storage device, further comprising a preamplifier, the preamplifier having a reverse bias power control circuit coupled to the at least one laser diode and configured to apply at least one reverse bias, including the first reverse bias, to the at least one laser diode.

In some aspects, the techniques described herein relate to a data storage device, wherein the at least one laser diode dissipates a first power when the forward bias is applied, and wherein the at least one laser diode dissipates a second power when the first reverse bias is applied.

In some aspects, the techniques described herein relate to a data storage device, wherein: the first power is the same or substantially the same as the second power; or the first power is greater than the second power.

In some aspects, the techniques described herein relate to a data storage device, wherein each of the at least one laser diode is positioned inside a corresponding laser diode cavity, and wherein the one or more processing devices are further configured to: apply a second reverse bias to the at least one laser diode to preheat a corresponding laser diode cavity to a target temperature prior to initiating the write operation.

In some aspects, the techniques described herein relate to a data storage device, wherein the target temperature corresponds to a steady-state temperature associated with the write operation and when the at least one laser diode is in a lasing state.

In some aspects, the techniques described herein relate to a data storage device, wherein a power dissipated by the at least one laser diode is the same or substantially the same when the first reverse bias, the second reverse bias, and the forward bias is applied.

In some aspects, the techniques described herein relate to a data storage device, wherein applying each of the first reverse bias and the second reverse bias includes applying a negative voltage, and wherein a value of each of the negative voltages is kept below an avalanche or breakdown voltage for the at least one laser diode.

In some aspects, the techniques described herein relate to a method of operating a data storage device, the method including: initiating a write operation, wherein initiating the write operation includes: activating a magnetic recording head corresponding to at least one laser diode of the data storage device, wherein each of the at least one laser diode is positioned inside a corresponding laser diode cavity, and applying a forward bias to the at least one laser diode; applying a first reverse bias to the at least one laser diode during at least one intervening event; and transitioning from applying the first reverse bias to the at least one laser diode to applying the forward bias to the at least one laser diode.

In some aspects, the techniques described herein relate to a method, wherein the at least one intervening event comprises an event selected from a group consisting of a track seek event and a servo wedge crossing event.

In some aspects, the techniques described herein relate to a method, wherein applying the first reverse bias to the at least one laser diode during the at least one intervening event includes: controlling transition of a preamplifier from applying the forward bias to the at least one laser diode to applying the first reverse bias; and wherein a temperature of a corresponding laser diode cavity is configured to stay the same or substantially the same after controlling the transition from the forward bias to the first reverse bias for the at least one laser diode.

In some aspects, the techniques described herein relate to a method, wherein, when the first reverse bias is applied to the at least one laser diode during the at least one intervening event: the at least one laser diode is in a non-lasing state, no data writing or overwriting occurs, and a temperature of a corresponding laser diode cavity is configured to stay the same or substantially the same after the transition from applying the first reverse bias to the forward bias for the at least one laser diode.

In some aspects, the techniques described herein relate to a method, further including selecting a first power, wherein the first power corresponds to a power dissipated by the at least one laser diode when the forward bias is applied; and selecting a second power, wherein the second power corresponds to a power dissipated by the at least one laser diode when the first reverse bias is applied.

In some aspects, the techniques described herein relate to a method, wherein one of: the first power is the same or substantially the same as the second power; or the first power is greater than the second power.

In some aspects, the techniques described herein relate to a method, further including: applying a second reverse bias to the at least one laser diode to preheat a corresponding laser diode cavity to a target temperature prior to initiating the write operation.

In some aspects, the techniques described herein relate to a method, wherein the target temperature includes a steady-state temperature associated with the write operation and when the at least one laser diode is in a lasing state.

In some aspects, the techniques described herein relate to a method, wherein a power dissipated by the at least one laser diode is the same or substantially the same when the first reverse bias, the second reverse bias, and the forward bias is applied.

In some aspects, the techniques described herein relate to a method, wherein applying each of the first reverse bias and the second reverse bias includes applying a negative voltage, and wherein a value of each of the negative voltages is kept below an avalanche or breakdown voltage for the at least one laser diode.

In some aspects, the techniques described herein relate to one or more processing devices including: means for initiating a write operation, wherein the means for initiating the write operation includes: means for activating a magnetic recording head corresponding to at least one laser diode of the data storage device, wherein each of the at least one laser diode is positioned inside a corresponding laser diode cavity, and means for applying a forward bias to the at least one laser diode; means for applying a first reverse bias to the at least one laser diode during the at least one intervening event; and means for transitioning from applying the first reverse bias to the at least one laser diode to applying the forward bias to the at least one laser diode.

In some aspects, the techniques described herein relate to a data storage device, including: one or more disks; an actuator arm assembly including one or more magnetic recording heads; a laser diode, wherein the laser diode is positioned inside a laser diode cavity; and one or more processing devices configured to: initiate a write operation, wherein initiating the write operation includes: activating a magnetic recording head corresponding to the laser diode, and applying a forward bias to the laser diode; pause application of the forward bias to the laser diode during an intervening event, the intervening event comprising one of a track seek event and a servo wedge crossing event; preheat the laser diode cavity during the intervening event; and resume application of the forward bias to the laser diode.

In some aspects, the techniques described herein relate to a data storage device, wherein preheating the laser diode cavity during the intervening event includes generating a first reverse bias; and controlling transition of a preamplifier from applying the forward bias to the laser diode to applying the first reverse bias.

In some aspects, the techniques described herein relate to a data storage device, wherein resuming application of the forward bias occurs with continuing the write operation, and wherein resuming application of the forward bias to the laser diode comprises controlling transition of the preamplifier from applying the first reverse bias to the laser diode to applying the forward bias to the laser diode; and wherein a temperature of the laser diode cavity is configured to stay the same or substantially the same after controlling the transition from the forward bias to the first reverse bias for the laser diode and vice-versa.

In some aspects, the techniques described herein relate to a data storage device, further including a heater for preheating the laser diode cavity during the intervening event, and wherein a temperature of the laser diode cavity is configured to stay the same or substantially the same during the intervening event. Specifically, but without limitation, the temperature of the laser diode cavity is configured to stay the same or substantially the same prior to, during, and after the intervening event.

Various further aspects are depicted in the accompanying figures and described below and will be further apparent based thereon.

BRIEF DESCRIPTION OF THE DRAWINGS

Various features and advantages of the technology of the present disclosure will be apparent from the following description of particular examples of those technologies, and as illustrated in the accompanying drawings. The drawings are not necessarily to scale; the emphasis instead is placed on illustrating the principles of the technological concepts. In the drawings, like reference characters may refer to the same parts throughout the different views. The drawings depict only illustrative examples of the present disclosure and are not limiting in scope.

FIGS. 2A and 2B illustrate conceptual block diagrams of a top view and a side view of a data storage device in the form of a disk drive, according to various aspects of the present disclosure.

DETAILED DESCRIPTION

Figure 1A:
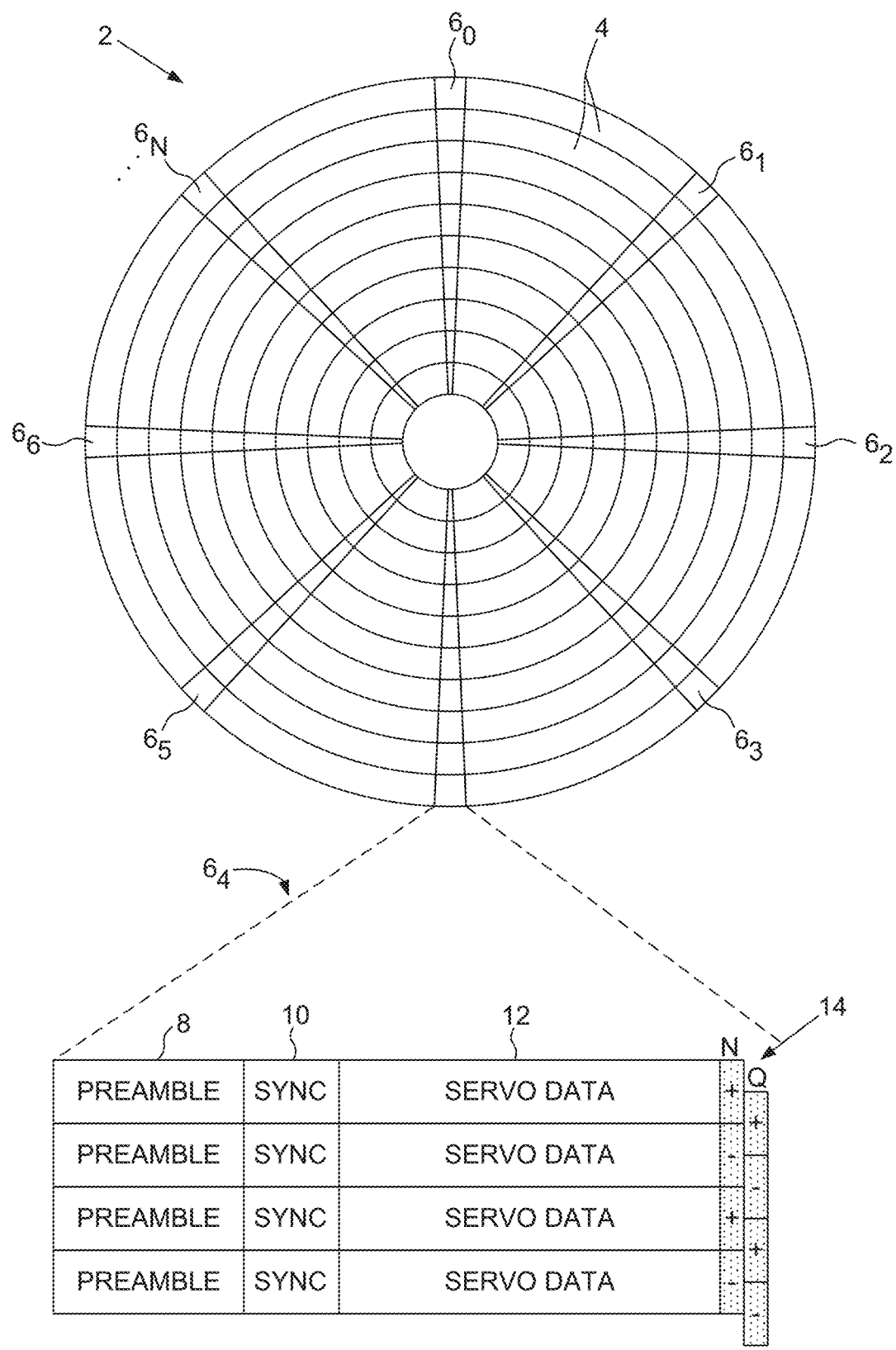
FIG. 1A shows a disk format as comprising a number of radially-spaced, concentric servo tracks defined by servo wedges recorded around the circumference of each servo track, according to various aspects of the present disclosure.

The word "exemplary" is used herein to mean "serving as an example, instance, or illustration." Any embodiment described herein as "exemplary" is not necessarily to be construed as preferred or advantageous over other embodiments.

The embodiments described below are not intended to limit the disclosure to the precise form disclosed, nor are they intended to be exhaustive. Rather, the embodiment is presented to provide a description so that others skilled in the art may utilize its teachings. Technology continues to develop, and elements of the described and disclosed embodiments may be replaced by improved and enhanced items, however the teaching of the present disclosure inherently discloses elements used in embodiments incorporating technology available at the time of this disclosure.

As used herein, the terms "servo wedges", "servo sectors", "sector ID", and "SID" may be used interchangeably throughout the disclosure. For example, FIG. 2A depicts simplified servo sectors 32 (e.g., servo sectors $32_1$ through $32_N$), where the servo sectors 32 may also be referred to as servo wedges 32, in some instances.

In some cases, laser diodes in Heat Assisted Magnetic Recording (HAMR) drives are susceptible to temperature-induced mode hopping, for instance, during the start of a write operation. During HAMR write, the temperature of a laser diode may increase (e.g., by 10-20 degrees C.), and several mode hop critical temperatures may be crossed during this temperature transient. In some circumstances, one or more mode hop events may be triggered during this transient phase, which may adversely impact write performance. For example, mode hop events during a HAMR write operation may result in non-uniformities in recording, which degrades HAMR recording performance. Broadly, aspects of the present disclosure are directed to preventing or reducing mode hops, which serves to enhance HAMR recording performance. In some circumstances, a laser diode (LD) of a data storage device cannot be fully energized in forward bias mode during certain disk drive operations (also referred to as intervening events), for instance, during track-to-track seeking and/or servo sector crossing. During write operations, a forward bias power is applied to the laser diode. The amount of forward bias power applied is based at least in part on a steady state temperature associated with the write operation. The laser diode cavity comprising the LD heats up when the forward bias power is applied to the LD. In some cases, the actuator assembly of the data storage device may seek between tracks, or alternatively, cross one or more servo wedges or sector IDs, during the write operation. In some cases, the preamplifier (or alternatively, the control circuitry) of the data storage device stops applying forward bias power to the LD when the magnetic recording head(s) of the actuator assembly are moved across different tracks (track-to-track seeking) or over a sector ID (sector crossing or servo wedge crossing). However, turning the LD off during a track seek and/or sector crossing may cause the temperature of the LD cavity to drop relative to the target or steady-state temperature (i.e., nominal temperature used during the write operation), which can inadvertently introduce one or more mode hops when the next forward bias is applied. Some aspects of the present disclosure are directed to applying a reverse bias power to the LD when certain intervening events are encountered, e.g., when seeking between different tracks or crossing a sector ID during a write operation, which may help eliminate or minimize the temperature transient and maintain the LD cavity temperature at or near the target temperature, as described in further detail below.

As a disk rotates under a slider of a hard disk drive (HDD), the slider 103 is said to "fly" above the disk. In some cases, a thermal fly-height control (TFC) device (e.g., heater element) can be disposed within a slider (e.g., slider 103, slider 902) to contort the slider near the read and write transducers (or elements), which lowers the fly-height for the read and write transducers. In some examples, read and write elements or transducers reside in the slider of an HDD.

In some cases, a disk drive may comprise fly-height control circuitry 106 that interfaces with fly-height components in the slider. Thermal fly-height control (TFC) is one prior art control technique that uses a heater element (not shown) disposed in the slider. The fly-height can be adjusted by heating the slider with the heater. Electrical current supplied to the heater by fly-height control circuitry 106 generates heat to thermally expand the slider and modulate the fly-height. The fly-height components 109 can also include other elements in addition to the heater. In some cases, the relative temperature at an air bearing surface (ABS) may be used to estimate the resistance, RRTD, of a resistive thermal detector (RTD), such as an embedded contact sensor (ECS) or a nearfield transducer temperature sensor (NTS). Typically, the resistance of a material can be represented as a function of its intrinsic resistance and its dimensions (e.g., length, width, thickness or height). A fly-height control system can also include nearfield transducer temperature sensors (NTS) 108 in the slider along the associated NTS control circuitry 107 in the arm electronics (AE) 102.

Figure 1B:
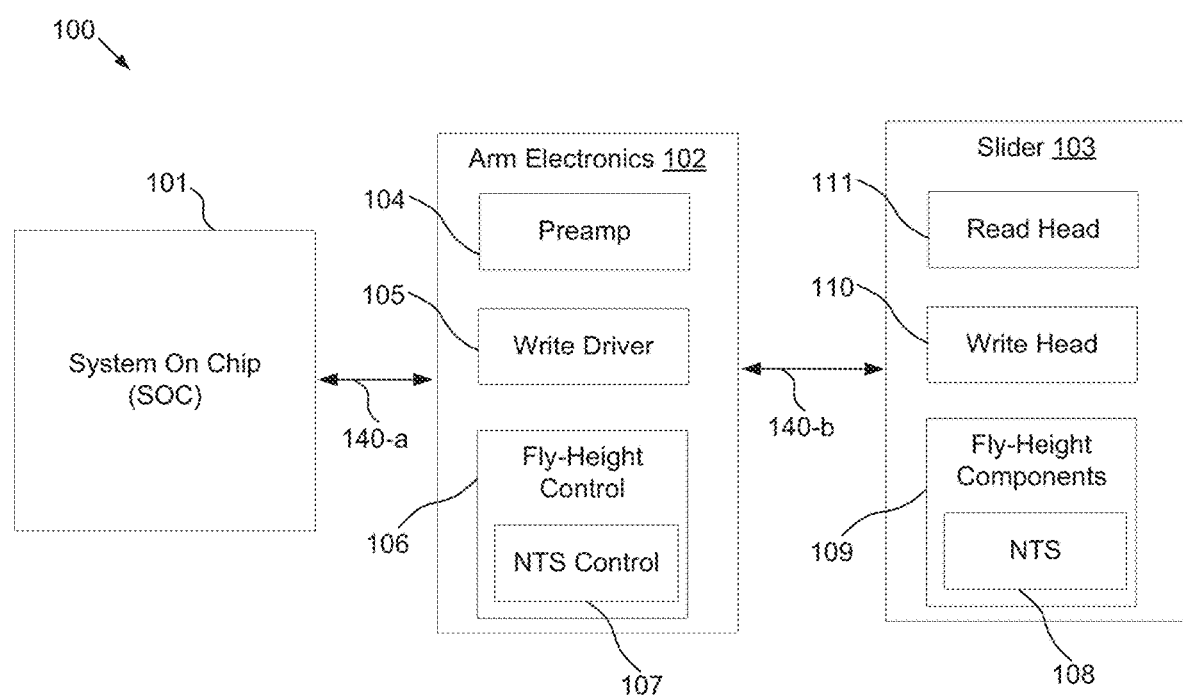
FIG. 1B shows a block diagram illustration of selected components of a disk drive, according to various aspects of the present disclosure.

A disk drive 100 according to various aspects of the disclosure, as seen in FIG. 1B, comprises a system on a chip (SOC) 101, where the SOC 101 comprises the electronics and firmware for the drive and used to control the functions of the drive including providing power and/or control signals to the components shown in AE chip 102. Each disk (shown as disks 16A-D in FIG. 2B) can have thin film magnetic material on each of the planar surfaces. Each recording surface may comprise a dedicated pair of read and write heads packaged in a slider 103 that is mechanically positioned over the rotating disk by an actuator (e.g., shown as actuator assembly 19 in FIG. 2B). In some examples, the actuator(s) also provide the electrical connections to the slider 103 components. The actuator assembly 19 may also comprise the arm electronics (AE) chip 102, the AE 102 comprising preamps 104 (e.g., read or write preamp) for the heads (e.g., read head 111, write head 110), write driver 105 and fly-height controls 106. In some examples, the fly-height control circuit 106 includes an NTS control circuit 107, for example, when the disk drive employs heat assisted magnetic recording (HAMR). It is noted that some of the components shown in AE 102 can be implemented or partially implemented in SOC 101 according to various aspects of the disclosure.

As seen, a first connection (e.g., flex cable) 140-a connects the SOC 101 to the AE 102, while a second connection (e.g., flex cable) 140-b connects the AE 102 to the slider 103. The AE 102 typically include digital and analog circuitry that control the signals sent to components in the slider 103 and process the signals received from the slider 103 components. The AE 102 can include registers that are set using serial data from the SOC 101 to provide parameters for the AE functions. The write driver 105 generates an analog signal that is applied to an inductive coil in the write head 110 to write data by selectively magnetizing portions of the magnetic material on the surface of the rotating disk(s) 16.

As seen, slider 103 includes write head 110 configured to write data to a disk, a read head 111 configured to read data from the disk, fly-height components 109 configured to adjust slider fly-height (as described above) and resistive temperature detector (RTD), such as NTS 108, for sensing the temperature near the air-bearing surface (ABS). It is noted that ABS is generally used to describe the surface of the slider facing the disk, where the disk drive could be filled with gases other than air (e.g., gases containing helium, hydrogen, to name two non-limiting examples) and that the use of the "ABS" term to describe various aspects of the disclosure is not intended to limit the disclosure to air filled drives. In some cases, the NTS 108 is located proximate to the ABS and write head 110 (or alternatively the read head 111). The NTS 108 facilitates detecting a temperature generated by the slider's proximity to the disk or media. In various embodiments, the NTS 108 may comprise a thermal strip (e.g., metallic or semiconductor strip) on the slider 103.

In some cases, a HAMR recording head (e.g., write head 110) also comprises optical components that direct light from a laser to the disk. During recording, a write element applies a magnetic field to a heated portion of the storage medium or disk, where the heat lowers the magnetic coercivity of the media, allowing the applied field to change the magnetic orientation of the heated portion. The magnetic orientation of the heated portion determines whether a one or a zero is recorded. Thus, by varying the magnetic field applied to the magnetic recording medium while it is moving, data can be encoded onto the medium. A HAMR drive uses a laser diode (LD) to heat the media to aid in the recording process. In some cases, the LD is disposed within an LD cavity and is proximate to a HAMR read/write element, where the read/write element has one end on the ABS of the slider 103. The ABS faces and is held proximate to a moving media surface during operation of the HDD.

Figure 9:
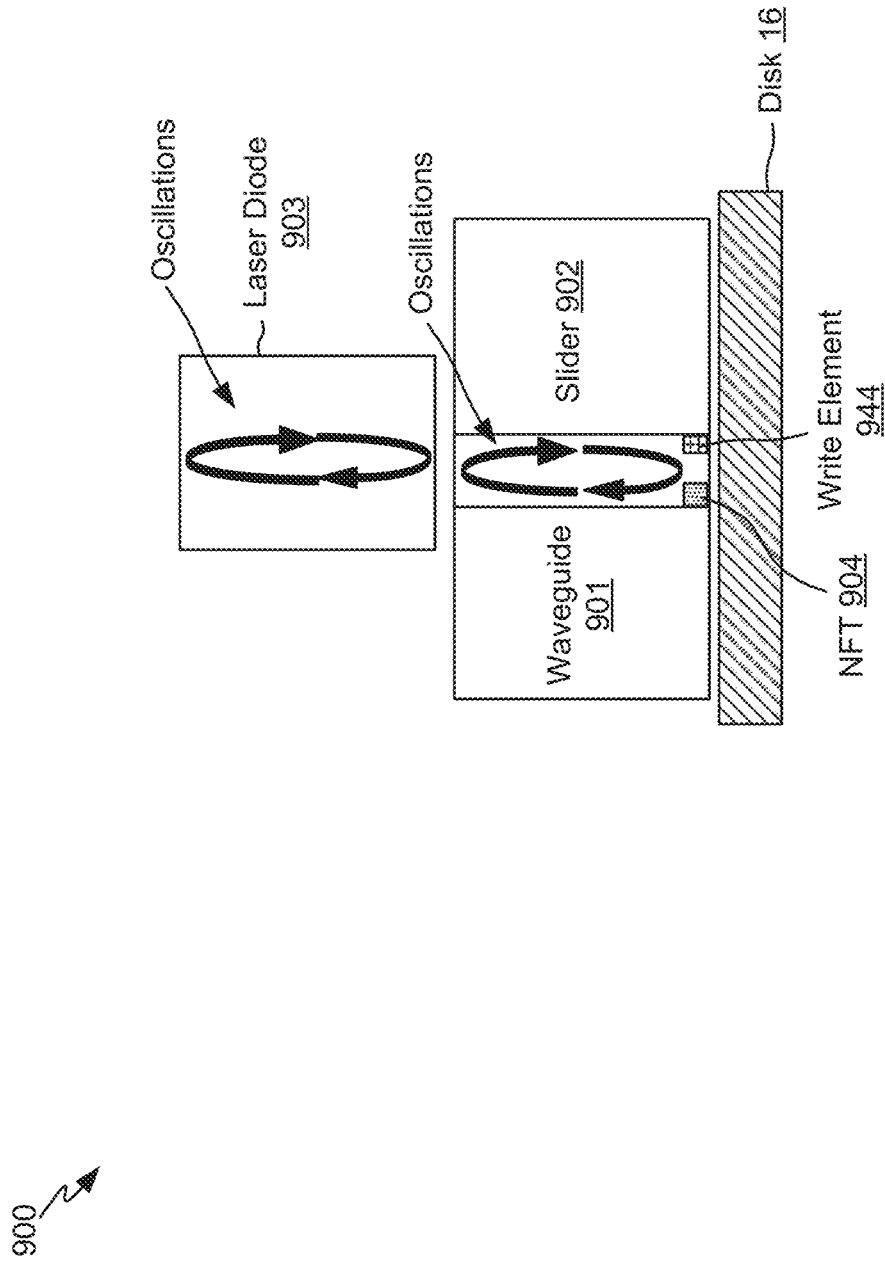
FIG. 9 illustrates a block diagram showing a waveguide, a laser diode, a disk, and a slider of a data storage device, according to various aspects of the present disclosure.

The LD (shown as laser diode 903 in FIG. 9) provides optical-based energy to heat the media surface, e.g., at a point near the read/write element. In some cases, optical path components, such as a waveguide 901, are formed integrally within the slider 902 to deliver light from the laser diode 903 to the near field transducer (NFT) which provides targeted heat to the media. For example, as shown in FIG. 9, a waveguide 901 and near field transducer (NFT) 904 may be located proximate a write element 944 to provide local heating of the media during write operations. In some circumstances, various components (e.g., write element 944, NFT 904, LD 903, etc.) may experience significant heating due to light absorption and inefficiencies in electrical-to-optical energy conversion as energy produced by the LD 903 is delivered to the magnetic recording medium or disk 16. In some cases, for example, during the start of a write operation, track-to-track seeking, and/or sector ID crossing (or servo wedge crossing), the temperature of the LD experiences significant variations, causing a shift in laser emission wavelength. This in turn leads to a change of optical feedback from the optical path in the slider 902 to the LD cavity, resulting in mode hopping (i.e., power instability) of the LD 903. Mode hopping can degrade performance of HAMR drives, as mode hopping leads to shifting/jumping of laser output power leading to one or more of magnetic track width variations and magnetic transition shifting between data blocks. Large transition shifts in data blocks may increase errors, degrading disk drive performance and/or causing encroachment on adjacent data tracks.

In some circumstances, mode hopping can be inadvertently introduced during a write operation, for instance, when seeking between tracks or while crossing over sector IDs. Specifically, the preamplifier (or the control circuitry) may cease application of forward bias (FB) power to the LD as the HAMR recording head is moved from one track to another or moved over a sector ID during a write operation. The sector IDs typically store servo information utilized in seeking and track following. In some aspects, discontinuing application of FB power to the LD during track-to-track seeking and servo sector crossing helps prevent overwriting/ erasing of previously written user data and degradation/ erasure of servo information, respectively. In some cases, however, the temperature in the LD cavity may also drop when the preamplifier stops applying power to the LD. For instance, the LD cavity temperature may deviate from the target or steady state temperature, where the steady-state temperature is associated with the write operation and when the LD is in a lasing state. In some cases, this deviation from the steady-state temperature may introduce one or more mode hops, which can adversely affect disk drive performance.

In accordance with aspects of this disclosure, reverse bias (RB) power may be applied to the LD during one or more intervening events of a write operation, which helps keep the LD cavity temperature at or near the steady-state temperature, thereby reducing or minimizing the likelihood of subsequent mode hops. Some non-limiting examples of intervening events of a write operation include a track-to-track seeking event and a sector ID crossing event (also referred to as a servo wedge crossing event).

In some circumstances, a laser "mode hops" when the temperature transient changes. For instance, a laser may suddenly switch from operating in one resonator mode (e.g., producing energy with a first wavelength) to another mode (e.g., producing energy with a second, different wavelength) when the temperature transient equals a mode hop critical temperature. The laser then operates in the new resonator mode (e.g., producing energy with the second wavelength) for a range of temperature transients before switching to a different resonator mode (e.g., producing energy with a third wavelength).

Aspects of the present disclosure are directed to eliminating or minimizing the temperature transients during certain disk drive operations (e.g., track-to-track seeking) by applying a reverse bias power to the LD to maintain the LD cavity temperature at or near the target or steady-state temperature (i.e., temperature used during the write operation), which serves to prevent mode hops and enhance HAMR recording performance.

Figure 3:
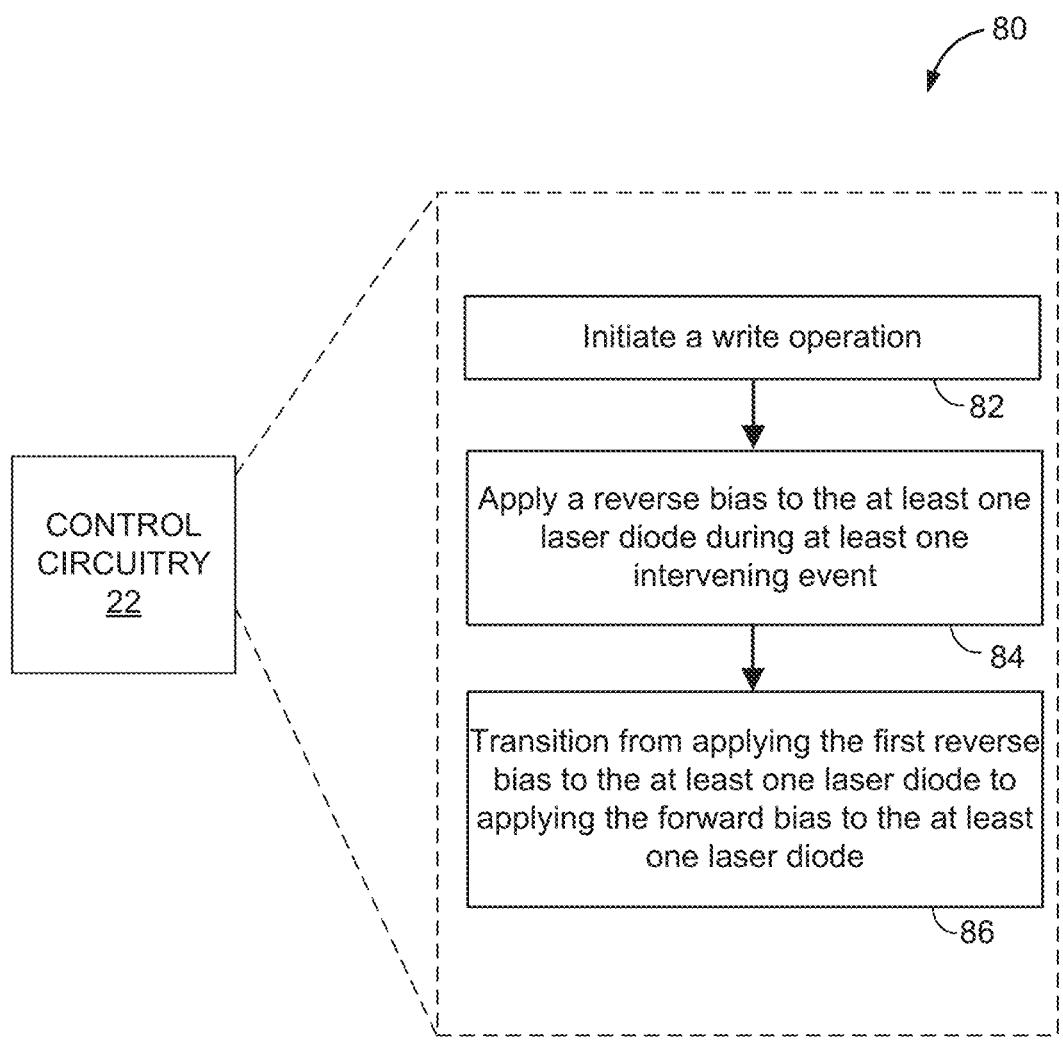
FIG. 3 illustrates a method that a data storage device may perform, execute, and implement, according to various aspects of the present disclosure.

Turning now to FIGS. 2A and 2B, which illustrate conceptual block diagrams of a top view and a side view of a data storage device in the form of a disk drive 15, in accordance with aspects of the present disclosure. Disk drive 15 comprises control circuitry 22, an actuator assembly 19, and a plurality of hard disks 16A, 16B, 16C, 16D ("hard disks 16," "disks 16"). FIG. 3 depicts a flowchart for an example method 80 that control circuitry 22 of disk drive 15 may perform or execute in controlling the operations of disk drive 15, including the operations of heads 18 (e.g., heads 18A-18H) disposed on actuator assembly 19, in accordance with aspects of the present disclosure, as further described below. Actuator assembly 19 thus comprises heads 18 and is configured to position the one or more heads 18 over disk surfaces 17 of the one or more disks 16. Heads 18 may each comprise write and read elements, configured for writing and reading control features and data to and from a corresponding disk surface 17 of hard disks 16.

Actuator assembly 19 comprises a primary actuator 20 (e.g., a voice coil motor ("VCM")) and a number of actuator arms 40 (e.g., topmost actuator arm 40A, as seen in the perspective view of FIGS. 2A and 2B). Each of actuator arms 40 comprises a head 18 at a distal end thereof (e.g., example head 18A comprised in topmost actuator arm 40A, in the view of FIGS. 2A and 2B). Each of actuator arms 40 is configured to suspend one of heads 18 in close proximity over a corresponding disk surface 17 (e.g., head 18A suspended by topmost actuator arm 40A over topmost corresponding disk surface 17A, head 18H suspended by lowest actuator arm 40H over lowest corresponding disk surface 17H). Various examples may include any of a wide variety of other numbers of hard disks and disk surfaces, other numbers of actuator arm assemblies and primary actuators besides the one actuator assembly 19 and the one primary actuator 20 in the example of FIGS. 2A and 2B, and other numbers of fine actuators on each actuator arm, for example.

FIG. 2A also depicts servo sectors 32 (e.g., servo sectors $32_1$ through $32_N$) written onto disk surfaces 17. In some examples, the servo sectors 32 (or servo wedges 32) on a disk drive may be curved, but for sake of illustration, the servo sectors 32 in FIG. 2A have been shown with straight lines. In some cases, when manufacturing a disk drive, servo sectors 32 may be written to disk surfaces 17 to define a plurality of evenly-spaced, concentric tracks 34. As an example, each servo sector 32 may include a phase lock loop (PLL) field, a servo sync mark (SSM) field, a track identification (TKID) field, a sector ID, and a group of servo bursts (e.g., an alternating pattern of magnetic transitions) that the servo system of the disk drive samples to align the moveable transducer head (e.g., disk head 18) with and relative to, a particular track 34. Each circumferential track 34 includes a plurality of embedded servo sectors 32 utilized in seeking and track following. The plurality of servo sectors 32 are spaced sequentially around the circumference of a circumferential track 34 and extend radially outward from the inner diameter (ID) of disk surface 17. These embedded servo sectors 32 contain servo information utilized in seeking and track following and are interspersed between data regions on disk surfaces 17. Data is conventionally written in the data regions in a plurality of discrete data sectors. Each data region is typically preceded by a servo sector 32. Host 25 may be a computing device such as a desktop computer, a laptop, a server, a mobile computing device (e.g., smartphone, tablet, Netbook, to name a few non-limiting examples), or any other applicable computing device. Alternatively, host 25 may be a test computer that performs calibration and testing functions as part of the disk drive manufacturing processing.

As seen in method 80 in FIG. 3, in some examples, the control circuitry 22 is configured to control the actuation of the primary actuator (i.e., VCM). Further, the VCM is configured to actuate the head 18 over the disk surfaces 17.

In some examples (80), the control circuitry 22 is also configured to initiate a write operation (82). Initiating the write operation (82) comprises (1) activating a magnetic recording head corresponding to at least one laser diode of the data storage device, wherein each of the at least one laser diode is positioned inside a corresponding laser diode cavity, and (2) applying a forward bias to the at least one laser diode. In some examples, the control circuitry 22 is further configured to apply a first reverse bias to the at least one laser diode during at least one intervening event (84); and transition from applying the first reverse bias to the at least one laser diode to applying the forward bias to the at least one laser diode (86). In some cases, the at least one intervening event comprises an event selected from a group consisting of a track-to-track seek event and a sector ID crossing (or servo wedge crossing) event. In some instances, applying the reverse bias to the at least one LD of the data storage device helps maintain a corresponding LD cavity at or near a steady-state or target temperature associated with the write operation. In some cases, the at least one intervening event comprises a plurality of intervening events. Furthermore, transitioning to applying the forward bias occurs with continuing the write operation. In some cases, continuing the write operation comprises at least one of resuming the write operation after each of the plurality of intervening events, and resuming the write operation between adjacent intervening events of the plurality of intervening events. Additionally, or alternatively, continuing the write operation further comprises continuing the write operation using the forward bias, wherein the write operation comprises writing data to, or overwriting data on, the one or more disks of the data storage device.

In the embodiment of FIG. 2A, the control circuitry 22 may also process a read signal 36 emanating from the head 18A to demodulate servo data written on the disk (e.g., servo sectors 32) to generate a position error signal (PES) representing an error between the actual position of the head and a target position relative to a target track. The control circuitry 22 may process the PES using a suitable servo control system to generate the control signal 38 (e.g., a VCM control signal) applied to the VCM 20 which rotates an actuator arm 40 about a pivot in order to actuate the head 18 radially over the disk surface 17 in a direction that reduces the PES. In one embodiment, the disk drive may also comprise a suitable microactuator, such as a suitable piezoelectric (PZT) element for actuating the head 18 relative to a suspension, or for actuating a suspension relative to the actuator arm 40.

In one embodiment, the servo data (e.g., servo sectors 32) read from the disk surface 17, i.e., in order to servo the head over the disk during access operations, may be self-written to the disk using the control circuitry 22 internal to the disk drive. In some examples, a plurality of spiral servo tracks are first written to the disk surface 17, and then servo sectors 32 are written to the disk while servoing on the spiral servo tracks. In order to write the spiral servo tracks to the disk surface 17, at least one bootstrap spiral track is first written to the disk without using position feedback from servo data (i.e., the actuator or VCM 20 is controlled open loop with respect to servo data on the disk). Before writing the bootstrap spiral track, feedforward compensation is generated by evaluating the BEMF voltage generated by the VCM 20 during a calibration seek (where the BEMF voltage represents an estimated velocity of the VCM). The bootstrap spiral track is then written to the disk using the feed-forward compensation. In some embodiments, the BEMF voltage representing the velocity of the VCM 20 may be sampled at any suitable sample rate in order to update the feed-forward compensation at any suitable frequency during seek operations.

FIG. 9 illustrates a block diagram 900 showing a waveguide (WG) 901, a laser diode (LD) 903, a disk 16, a near field transducer (NFT) 904, and a slider 902 of a data storage device, according to various aspects of the present disclosure. As seen, the WG 901 and the NFT 904 are located proximate a write element 944 to provide local heating of the media (i.e., disk 16) during write operations. In some cases, the LD 903 produces optical energy (e.g., having a wavelength between 700-900 nm), which is converted to heat that is delivered to the magnetic recording medium or disk 16. In some examples, the LD 903 may be preheated prior to the start of a write operation by applying a reverse bias (or negative voltage) to the LD 903. The LD 903 may not emit laser light while the reverse bias is applied. In such cases, no data writing, rewriting, and/or erasure occurs. In this way, the LD cavity in which the LD 903 is positioned is preheated when the reverse bias is applied to the LD 903. To begin writing (or rewriting) data on the disk 16, the bias applied to the LD 903 is switched from a reverse bias to a forward bias. In some cases, the temperature of the LD 903 is configured to stay the same or substantially the same when the bias is switched to the forward bias, which serves to minimize the temperature transients, as compared to the prior art. In some aspects, reverse biasing of the LD 903 to preheat it before commencing the write operation facilitates enhanced control of the LD steady-state temperature, which helps avoid mode hops related to temperature transients at or near the start of a write operation. In some cases, the LD 903 is maintained in the pre-heat state before actually starting the write operation, which helps minimize or reduce laser-on transition time. Further details relating to the application of a reverse bias are provided in co-pending and co-owned U.S. Patent Appl. No. 63/426,176, filed Nov. 17, 2022, and entitled "Preheating Laser Diodes with Reverse Bias for HAMR Disk Drives," the disclosure of which is hereby incorporated by reference.

In some embodiments, the joule power dissipation selected for the reverse bias condition may be based on the expected joule power dissipation in the forward bias condition. For instance, the reverse bias joule power is selected based on the I-V characteristics of the LD 903 and the forward bias or operating joule power, as described below in relation to FIG. 11.

In some embodiments, the LD 903 may also be reverse biased during one or more disk drive operations, such as, but not limited to, track-to-track seeking and servo sector crossings. As noted above, prior art techniques typically cease applying forward bias power (or apply limited amounts of forward bias power, e.g., <50% of the forward bias power used during the write operation) to the LD to prevent accidental erasure/overwriting of servo information or previously written user data. In some circumstances, however, this causes the LD cavity temperature to deviate from the steady-state temperature, resulting in one or more mode hops. Reverse biasing of the LD 903 can help keep the LD cavity temperature at or near the steady-state temperature, which minimizes or reduces the likelihood of subsequent mode hops.

Figure 11:
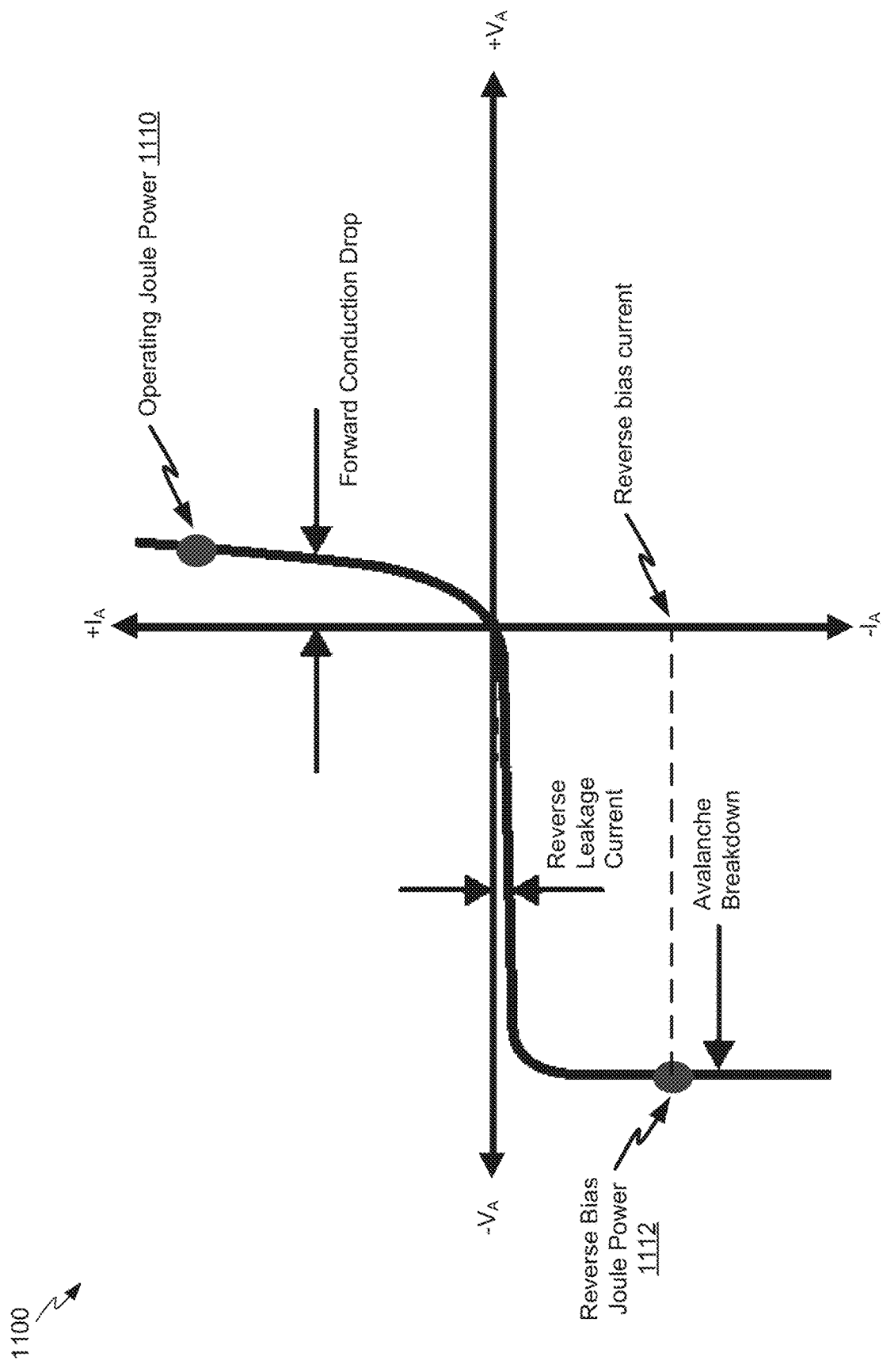
FIG. 11 illustrates an example of an I-V curve of a laser diode, including the joule powers dissipated in the forward and reverse bias modes, according to various aspects of the present disclosure.

FIG. 11 illustrates an example of an I-V curve 1100 for a laser diode, such as LD 903, according to various aspects of the disclosure. Specifically, but without limitation, the I-V curve 1100 in FIG. 11 depicts an example of the methodology used to select a joule power for the laser diode, i.e., when the laser diode is in the reverse bias condition. As seen, in some embodiments, the reverse bias joule power 1112 is selected based on the operating joule power 1110 (i.e., the expected joule power when the laser diode is forward biased). Here, the reverse bias joule power 1112, which can be calculated as the product of the reverse bias voltage and the reverse bias current, is equal to the operating joule power 1110. Since the reverse bias voltage is equal to the avalanche or breakdown voltage of the LD, the reverse bias current can be calculated based on the reverse joule power 1112 and the breakdown voltage (e.g., −10V, −15V, etc.).

When in the forward bias mode, the thermal signal (e.g., from ECS, NFT, which sense thermal changes) and the optical signal (e.g., from laser diode or photodiode) increase after the threshold current is exceeded. Additionally, when in the reverse bias mode, only the thermal signal (but not optical signal) increases, as expected, beyond the breakdown voltage of the laser diode. In some cases, when in the reverse bias mode, the current and power of the laser diode is controlled such that a maximum threshold current and power is not exceeded (i.e., the same as specified for the forward bias mode), which helps prevent the laser diode from damaging and/or degrading in the reverse bias mode.

Figure 12:
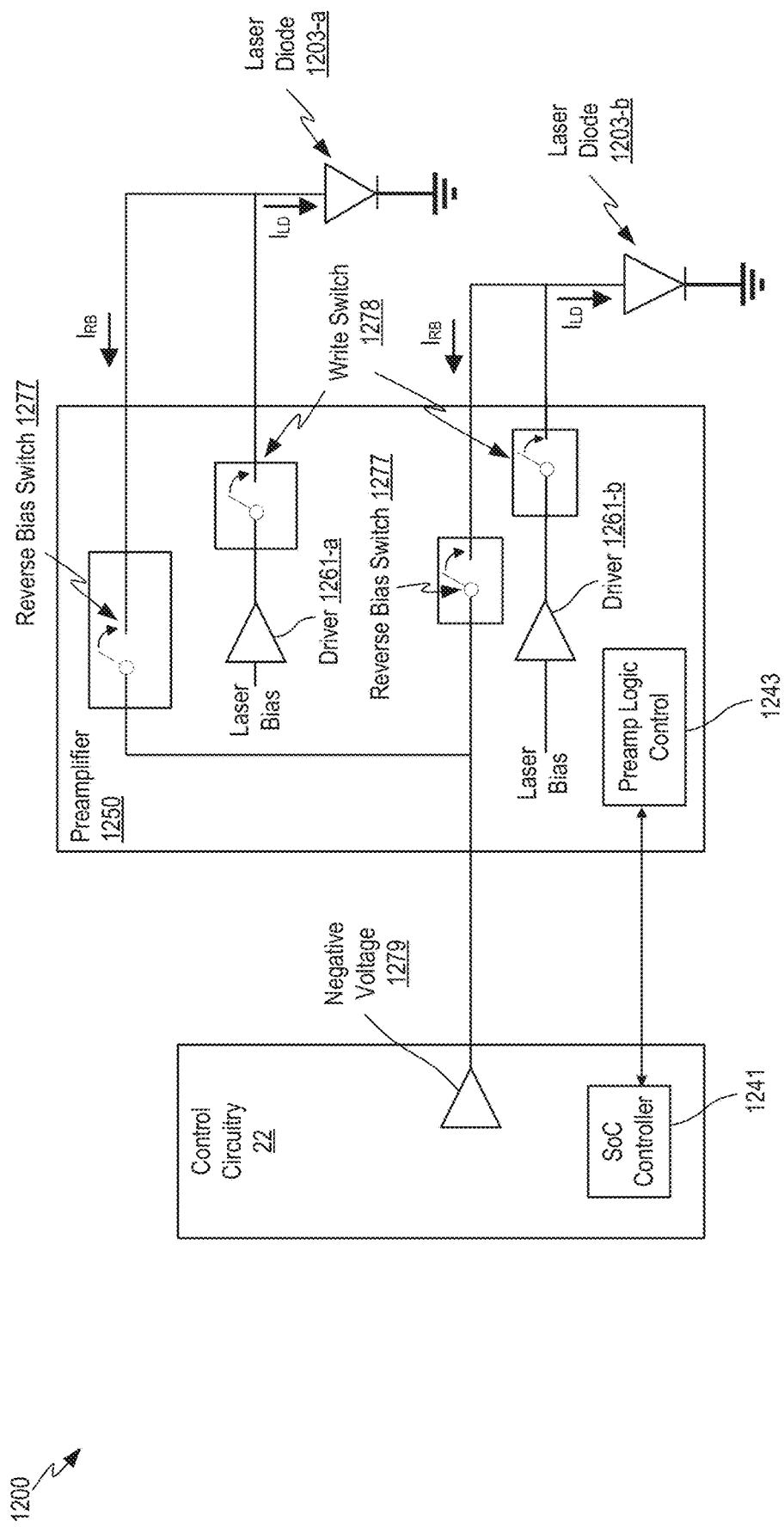
FIG. 12 is a block diagram showing some example components that may be used to effectuate reverse bias control of a laser diode, for example, during one or more intervening events of a write operation, according to various aspects of the present disclosure.

FIG. 12 is a block diagram 1200 showing some example components that may be used to effectuate reverse bias control of laser diode(s) of a HAMR data storage device, according to various aspects of the present disclosure. As seen, FIG. 12 shows the control circuitry 22 including a SOC controller 1241, a preamplifier 1250 having one or more LD drivers 1261 (e.g., LD driver 1261-*a*, LD driver 1261-*b*), one or more laser diodes 1203 (e.g., laser diode 1203-*a*, laser diode 1203-*b*), and one or more switches (e.g., shown as reverse bias switch 1277, write switch 1278). In some embodiments, the preamplifier 1250 further includes an optional preamp logic control module 1243 that is electronically and/or communicatively coupled to the SOC controller 1241.

In some cases, the control circuitry 22 may be configured to generate a negative voltage 1279 for reverse biasing the laser diode(s) 1203. A reverse bias switch 1277 in series connection to a corresponding laser diode may be closed to enable application of the negative voltage 1279 to the LD 1203. As noted above, when the laser diode(s) 1203 are in reverse bias condition, they generate heat but do not emit laser light, which prevents data writing, overwriting, or erasures on the magnetic recording medium. In this way, the laser diode cavity (in which a laser diode is disposed) is preheated, which helps minimize temperature transients at or near the start of a write operation. Additionally, or alternatively, reverse biasing of the LD can also help prevent temperature transients during one or more intervening events (e.g., track-to-track seeking and/or servo sector crossing, to name two non-limiting examples). Specifically, reverse biasing the LD can help minimize or prevent temperature fluctuations of the LD cavity with respect to the steady-state temperature since the LD is not forward biased (i.e., the LD is in a non-lasing state) during such operations. In other words, if the LD is turned off during a track seek or a servo sector crossing, the LD cavity temperature may drop off dramatically and introduce mode hops.

In some cases, the control circuitry 22 (or alternatively the SoC controller 1241) determines which head (not shown) the reverse bias voltage is applied to. In some embodiments, the preamplifier 1250 comprises one or more internal multiplexers (muxes) to isolate the laser diode(s) 1203 in reverse bias mode. Once the laser diode and laser diode cavity are preheated, the laser diode bias is switched from the reverse bias condition to the forward bias condition. In one non-limiting example, control circuitry 22 opens the reverse bias switch 1277 coupled to a corresponding one of the laser diodes 1203. Further, a forward bias (shown as laser bias) is applied and the write switch 1278 in series connection with the driver 1261 is closed, which causes a forward current ($I_{LD}$) to flow through the laser diode 1203.

In some embodiments, the LD bias is also switched from the forward bias condition to the reverse bias condition, for instance, prior to an intervening event (e.g., track seek or servo crossing operation) of a write operation. While not necessary, the reverse bias power may be based at least in part on a first power dissipated by the LD during the preheating and when in a non-lasing state and/or a second power dissipated by the LD during the write operation and when in a lasing state. In some embodiments, the first power is equal to or substantially equal to the second power. Furthermore, the reverse bias power applied during the track seek and/or servo crossing operations may be equal to the first power (i.e., reverse bias power used to preheat the LD prior to starting the write operation) and/or the second power (i.e., forward bias power used during the write operation).

Figure 10:
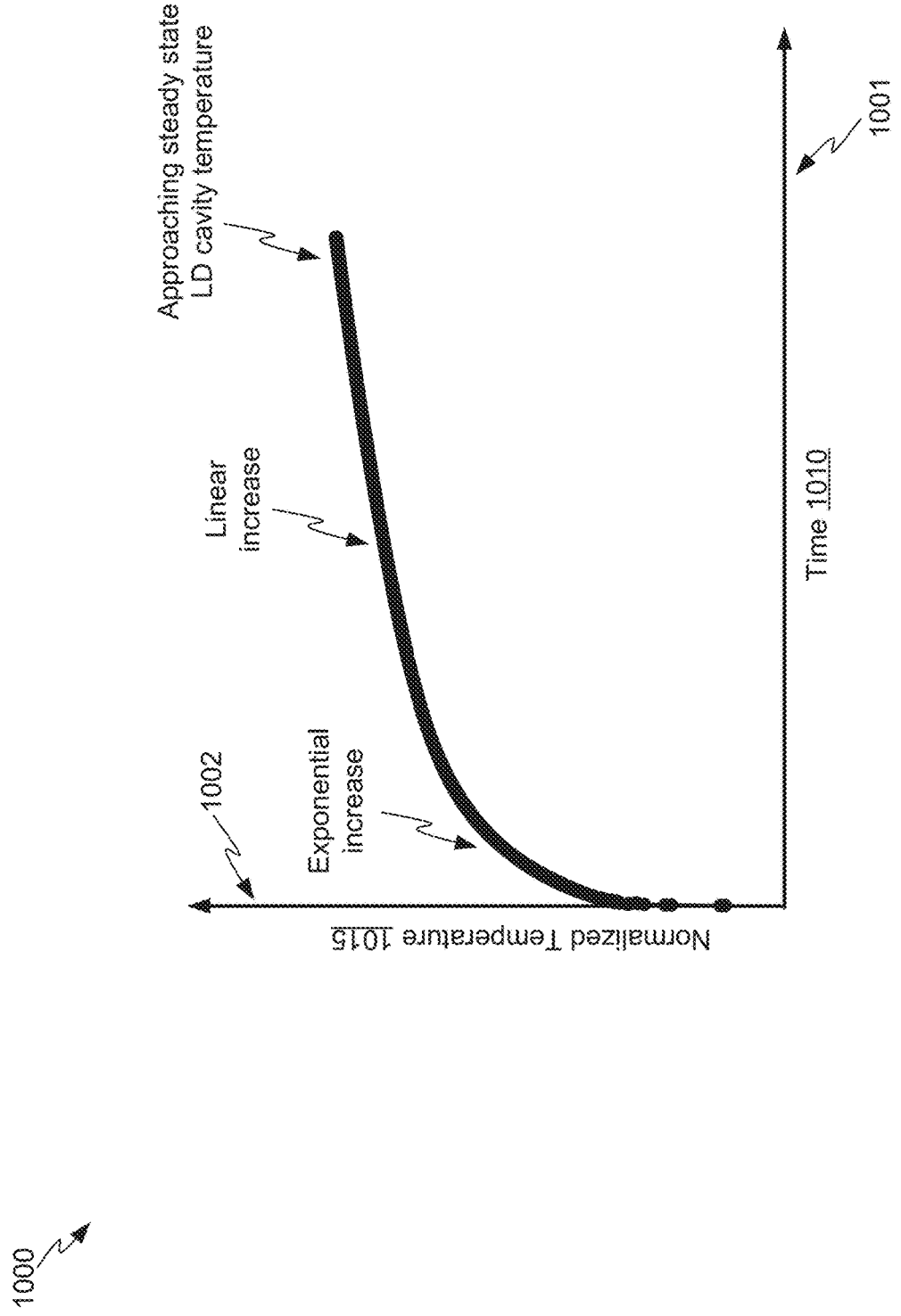
FIG. 10 illustrates a conceptual graph of laser diode cavity temperature against time during a write operation, according to various aspects of the present disclosure.

FIG. 10 illustrates a conceptual graph 1000 of normalized temperature 1015 (on vertical or y-axis 1002) of an LD cavity against time 1010 (on horizontal or x-axis 1001), according to various aspects of the present disclosure. As seen, the normalized temperature 1015 of the LD cavity experiences a sharp/exponential increase when a forward bias is applied at or near the start of a write operation. After this exponential section, the normalized temperature curve increases in a linear or substantially linear fashion before the normalized temperature reaches a steady-state value. It should be noted that the normalized temperature curve depicted in FIG. 10 is exemplary only and not intended to be limiting. For instance, in some examples, the normalized temperature 1015 curve may have an exponential shape. In some cases, the steady-state temperature is the nominal/operating temperature of the forward biased laser diode during the write operation. Some aspects of the present disclosure are directed to preheating the laser diode cavity by applying a negative voltage (or reverse bias) to the laser diode, such that the temperature of the LD cavity (or LD) is at or near the steady-state temperature prior to the start of the write operation. In this way, the unwanted LD cavity temperature transients (i.e., shown by way of the exponential increase portion of graph 1000 in FIG. 10) are avoided, which also helps avoid mode hops associated with the temperature transients at write start. Additionally, aspects of the present disclosure are also directed to applying a negative voltage (or reverse bias) to the laser diode during one or more intervening events of a write operation, which helps maintain the LD cavity temperature at or near the steady-state temperature and thereby helps avoid mode hops, as compared to the prior art.

Figure 4:
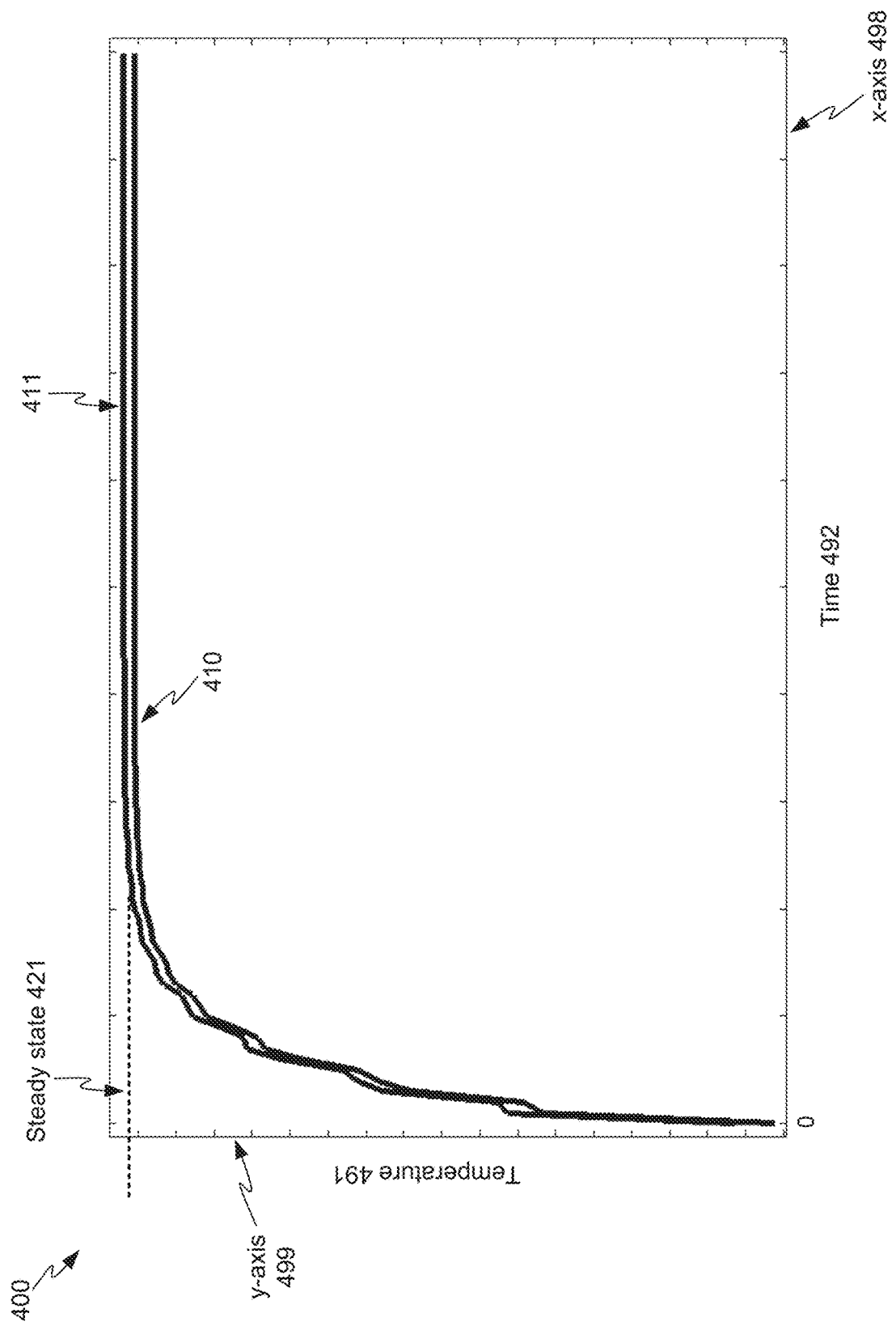
FIG. 4 illustrates a conceptual graph showing laser diode cavity temperature against time during a write operation, according to various aspects of the disclosure.

Turning now to FIG. 4, which illustrates a conceptual graph 400 showing the relation of temperature 491 (on the vertical or y-axis) against time 492 (on the horizontal or x-axis). Graph 400 depicts two traces 410, 411, where trace 410 corresponds to the estimated temperature of an LD cavity when an LD (i.e., positioned in the interior of the LD cavity) is forward biased. Furthermore, trace 411 corresponds to the actual temperature of the LD cavity when the LD is forward biased. As seen, there is good agreement between the estimated temperature (estimated using a model of the LD cavity, LD, and any other relevant components of the data storage device) and the actual measured temperature. Graph 400 also depicts the duration of a disk revolution (e.g., one revolution 425) as well as the steady state temperature 421. As noted above, the steady state temperature 421 corresponds to the target temperature of the LD cavity during the write operation. In some circumstances, one or more disk revolutions are needed before the LD cavity temperature is at or near the steady state 421. In some embodiments, preheating the LD cavity by reverse biasing the LD helps ensure the steady state (or target) temperature is reached before commencing the write operation.

Figure 5:
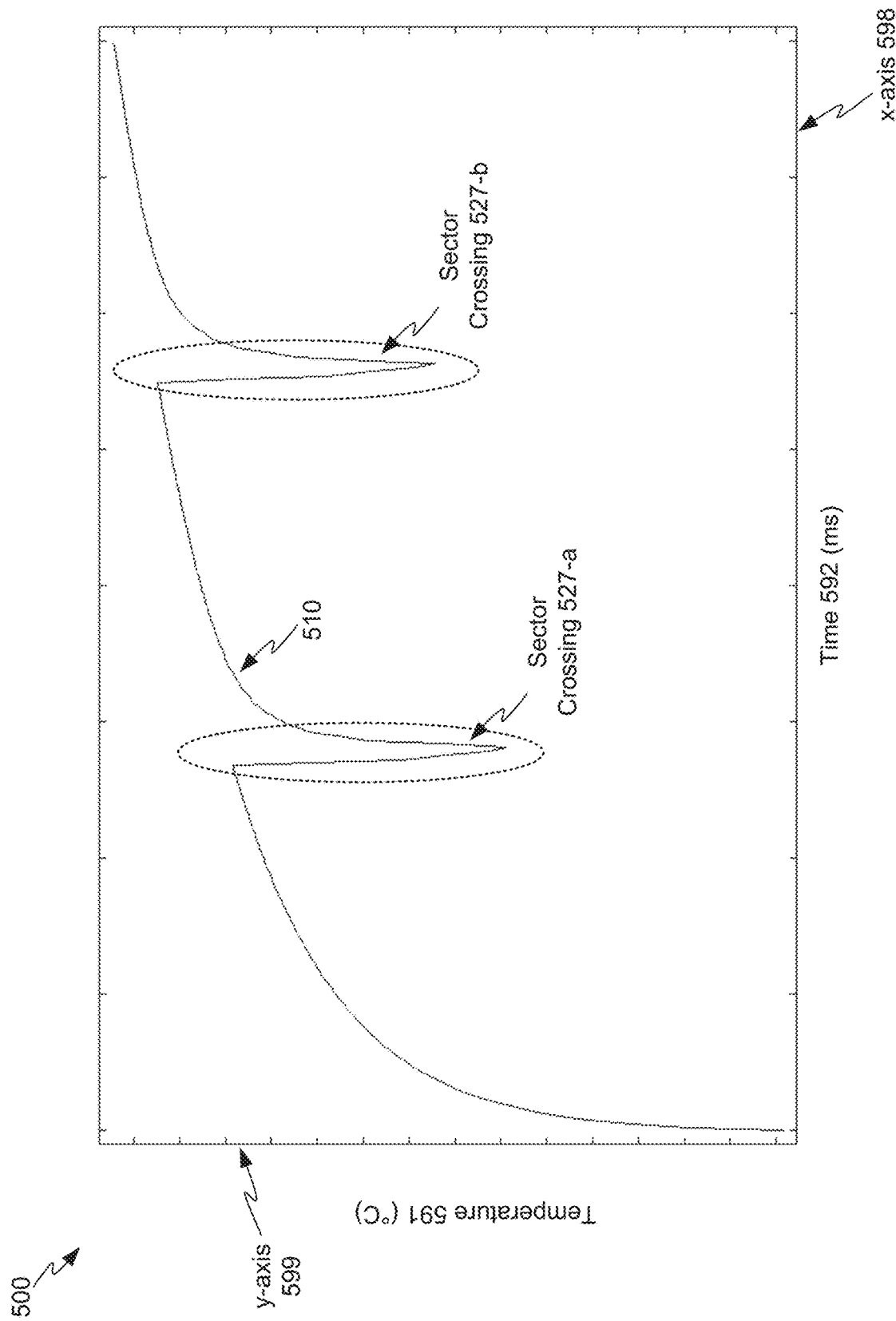
FIG. 5 illustrates a conceptual graph showing change in laser diode cavity temperature over servo wedges or sector IDs, according to various aspects of the disclosure.

FIG. 5 illustrates a conceptual graph 500 showing temperature 591 (on the vertical or y-axis 599) against time 592 (on the horizontal or x-axis 598) for an LD cavity. Graph 500 comprises a trace 510 depicting LD cavity temperature against time for a data storage device. As seen, the trace 510 comprises a plurality of dips, each corresponding to a servo sector crossing 527 (e.g., servo sector crossing 527-*a*, servo sector crossing 527-*b*). As noted above, when a servo sector crossing is encountered (or about to be encountered), the control circuitry 22 temporarily stops applying forward bias power to the LD. This causes the LD cavity temperature to drop for a brief duration, as shown by the sector crossing 527 dips. In some circumstances, the control circuitry 22 (or another component) of the data storage device resumes applying forward bias power to the LD after each sector crossing 527, which helps raise the LD cavity temperature to the target temperature.

In accordance with aspects of the present disclosure, the LD can be reverse biased during the servo sector crossing(s) 527, which prevents or reduces the temperature transients (or temperature dips) seen in FIG. 5. Additionally, once the SID (i.e., servo sector or servo wedge) is crossed by the writer, the control circuitry 22 transitions the LD from operating in the reverse biased (and non-lasing) state to a forward biased (and lasing) state, which resumes the write operation. In some cases, the reverse bias (RB) power applied to the LD during the crossing of a servo wedge can be based at least in part on the FB power applied during the write operation. This further helps minimize or reduce the temperature transients and/or mode hops encountered while crossing a servo wedge.

Alternatively, an external heater may be provided in the HDD, where the external heater is utilized to help maintain the LD cavity temperature at or near the steady-state temperature during servo wedge crossings, track-to-track seeking events, etc. In some instances, the external heater is activated (or turned on) prior to the intervening event (e.g., servo wedge crossing event) and kept in this state until or near the end of the intervening event. At or near the end of the intervening event, the external heater is turned off and the preamplifier resumes application of forward bias power to the LD to continue the write operation. In some examples, the preamplifier pauses application of forward bias power to the LD during the intervening event and when the external heater is turned on.

Figure 6:
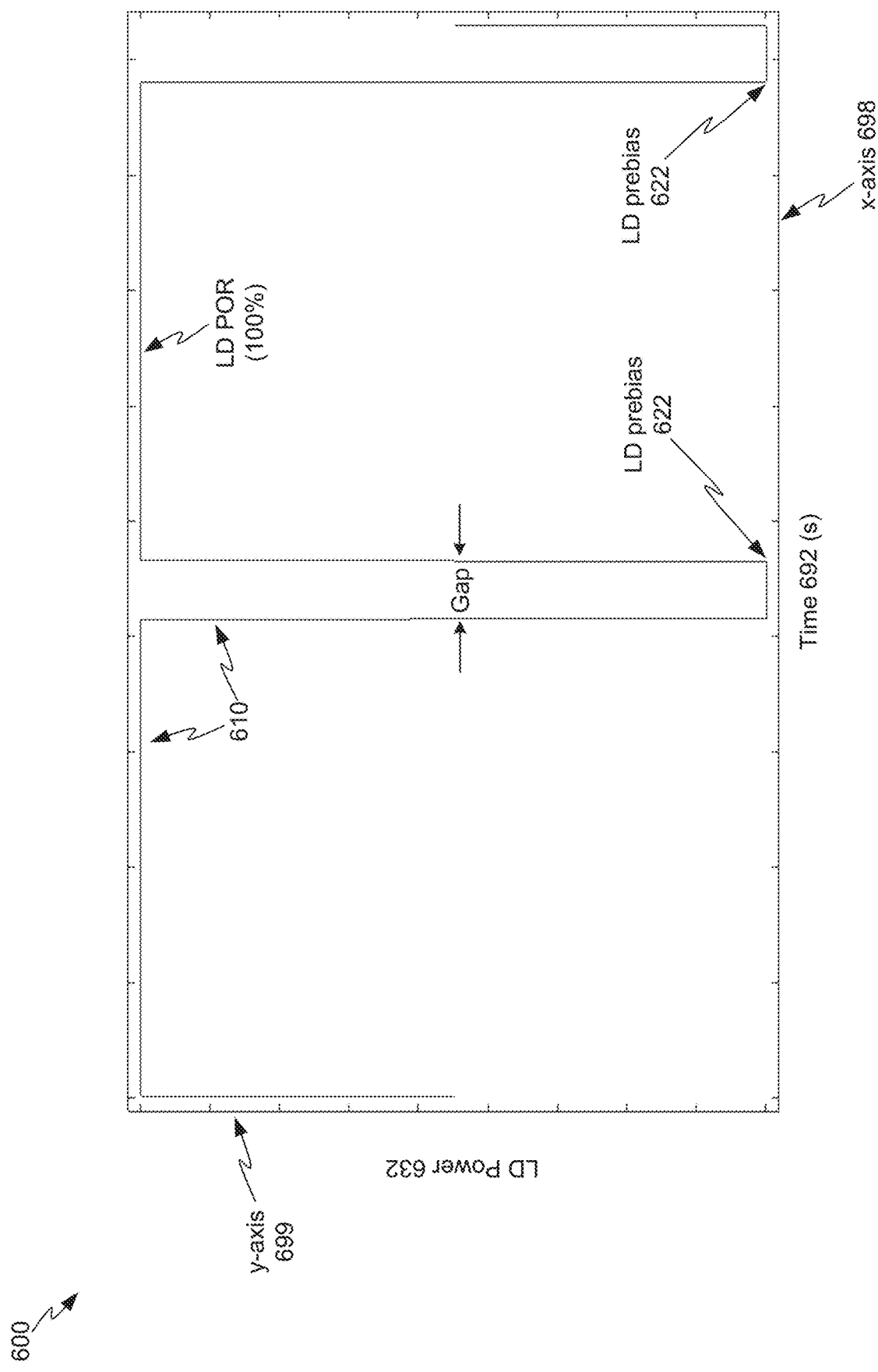
FIG. 6 illustrates a conceptual graph showing change in laser diode cavity temperature during a track seek, according to various aspects of the disclosure.

FIG. 6 illustrates a conceptual graph 600 showing LD power 632 (on the vertical or y-axis 699) against time 692 (on the horizontal or x-axis 698). Here, graph 600 comprises a trace 610 depicting the forward bias power (i.e., LD power) applied to the LD during a track seek against time for a data storage device. In this example, there is a gap during which the forward bias power applied to the LD is reduced. Specifically, the forward bias power applied to the LD goes from 100% power level per a plan of record (POR, i.e., certain default full power setting) to a reduced value (e.g., LD prebias 622 value) while seeking to another track. After seeking to the new track, the forward bias power applied to the LD is increased back to 100% POR. In some cases, this gap during which a reduced power is applied to the LD may be anywhere between 0.5 to 2 ms, for instance, around 1 ms. In some instances, this 1 ms gap may cause the temperature of the LD cavity to decrease from the steady-state value (e.g., the target temperature for the write operation), which can inadvertently lead to one or more mode hops if one or more temperature transients are crossed.

Figure 7:
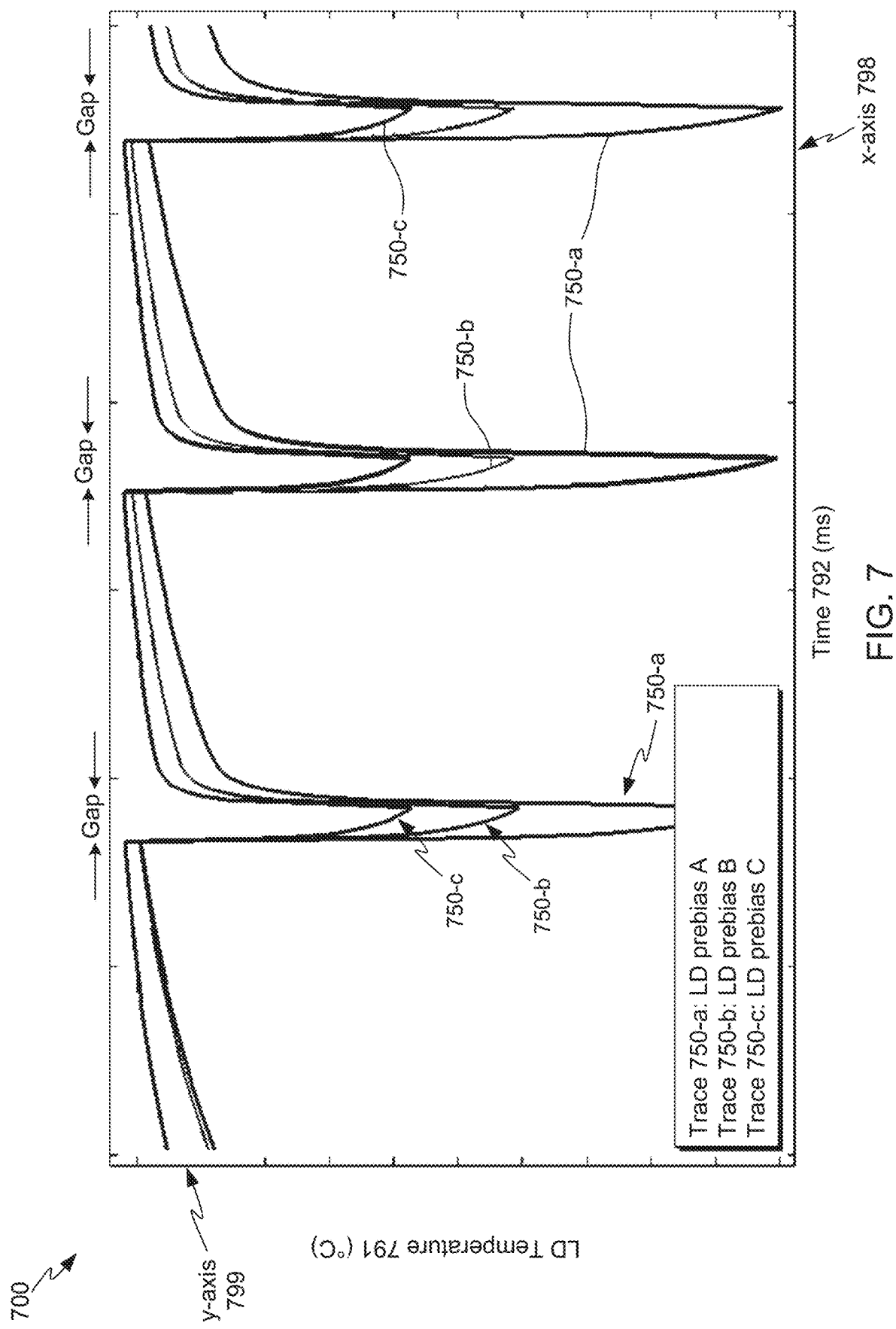
FIG. 7 illustrates a conceptual graph showing laser diode temperature transients for various laser prebias conditions, according to various aspects of the disclosure.

FIG. 7 illustrates a conceptual graph 700 showing LD temperature 791 (on the vertical or y-axis 799) against time 792 (on the horizontal or x-axis 798). Here, graph 700 shows a plurality of traces 750-*a*, 750-*b*, 750-*c*, where each trace 750 corresponds to a different LD prebias (e.g., LD prebias A, LD prebias B, LD prebias C). In some cases, LD prebias C>LD prebias B>LD prebias A. In some cases, the forward bias power applied to the LD may be varied from 100% POR (e.g., when user data is being written to the disk(s) during a write operation) to a reduced value (e.g., during a track seek). In some aspects, the graph 700 depicts the LD temperature transients for various laser prebias conditions (or various LD preheat percentages).

As seen, the LD temperature transients decrease as the LD prebias ratio increases. Specifically, trace 750-*a* corresponding to a lower LD prebias ratio shows the largest LD temperature transient, followed by trace 750-*b* and trace 750-*c*. While using a higher prebias ratio leads to a lower LD temperature transient, this is not without its consequences.

Specifically, a higher prebias ratio can increase the likelihood of accidental data erasures since the LD is forward biased and in a lasing state (albeit at a lower power than during the write operation). To minimize the chance of data erasure during a track seek, currently used techniques typically limit the LD prebias ratio during the track seek gaps to a lower level.

Aspects of the present disclosure are directed to reverse biasing a LD prior to or during a track-to-track seek and/or sector crossing operation, which helps minimize LD temperature transients by maintaining the LD cavity temperature at or near the steady-state or target temperature (i.e., 100% POR). Additionally, since the LD is reverse biased (i.e., in a non-lasing state), there is minimal risk of accidentally erasing previously written user data (e.g., during a track-to-track seek) and/or erasing critical servo information written to the servo sectors.

Figure 8:
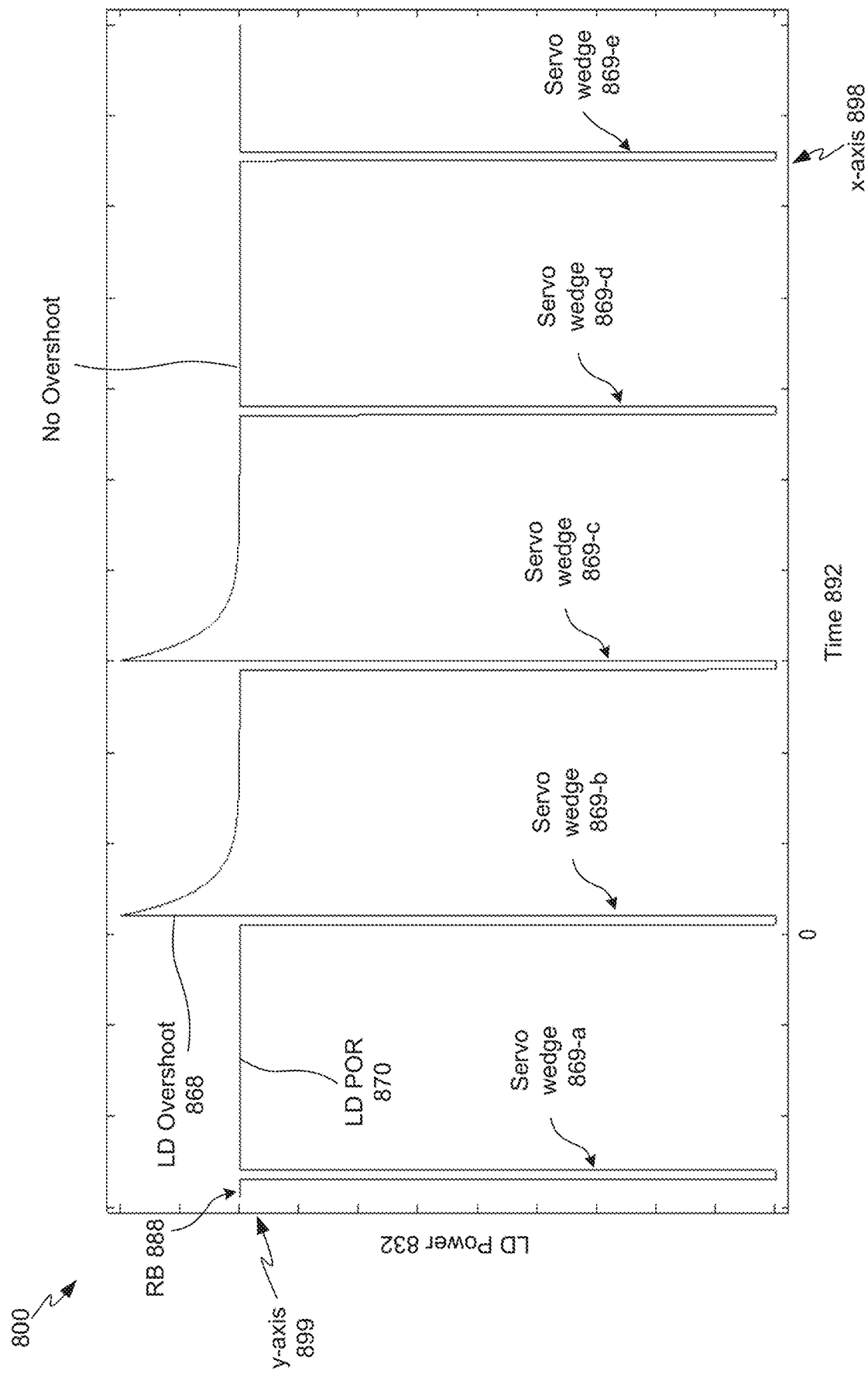
FIG. 8 illustrates a conceptual graph showing change in laser diode cavity temperature during servo wedge or sector ID crossings, according to various aspects of the disclosure.

FIG. 8 illustrates a conceptual graph 800 showing LD power 832 (on the vertical or y-axis 899) against time 892 (on the horizontal or x-axis 898). Here, graph 800 shows a trace 810 depicting the forward bias power (i.e., LD power) applied to the LD during a normal write operation, as well as during the crossing of one or more servo wedges (also referred to as servo sectors or sector IDs, or simply SIDs). For instance, a reverse bias (RB) 888 is initially applied to the LD to preheat the LD to a target or steady-state temperature associated with the write-operation. Graph 800 depicts a first crossing of a servo wedge 869-a. As seen, the LD power is reduced during the crossing of the servo wedge 869-a to prevent erasing the servo information stored in servo wedge 869-a. Next, the forward bias power applied to the LD is increased to 100% POR, where 100% POR corresponds to the LD forward bias power used during the write operation. As seen, the LD power is reduced again at or around the time when a second servo wedge 869-b is being crossed. In some examples, an overshoot (e.g., LD overshoot 868) may be utilized after crossing of a servo wedge (e.g., servo wedge 869-b, servo wedge 869-c), where the overshoot may be at or around 10% of the LD POR 870. In other words, the forward bias power corresponding to the LD overshoot 868 is around 10% greater than the forward bias power corresponding to the LD POR 870. This overshoot can help reduce or minimize NFT protrusion effects, in some embodiments.

In some instances, no overshoot is utilized after one or more servo wedge 869 crossings (e.g., after crossing servo wedges 869-d, 869-e), in which case the forward bias power applied after the crossing is equal or roughly equal to the LD POR 870.

In accordance with aspects of the disclosure, a reverse bias can be applied during the servo wedges or SIDs 869 (i.e., in lieu of backing off from applying any power), where the magnitude of the reverse bias power can be equal or substantially equal to the magnitude of the forward bias power (e.g., LD POR 870). As previously noted, this helps prevent deviation of the LD cavity temperature relative to the steady-state temperature, thus enhancing HAMR drive performance.

In some embodiments, an external heater may be employed (i.e., in lieu of applying a reverse bias) and the same or substantially the same transient temperature can be applied to prevent deviation of the LD cavity temperature relative to the steady-state temperature during servo wedge (or servo sector) crossing events.

Thus, the present disclosure helps enhance HAMR drive performance by applying heat to the LD cavity prior to or during servo sector or servo wedge crossings to maintain LD cavity temperature for seeks or SIDs, where the heat may be applied by (1) the use of reverse bias for the LD, or (2) using an external heater or heating element.

Any suitable control circuitry (e.g., control circuitry 22 in FIG. 2A) may be employed to implement the flow diagrams in the above examples, such as any suitable integrated circuit or circuits. For example, the control circuitry may be implemented within a read channel integrated circuit, or in a component separate from the read channel, such as a data storage controller, or certain operations described above may be performed by a read channel and others by a data storage controller. In one example, the read channel and data storage controller are implemented as separate integrated circuits, and in another example, they are fabricated into a single integrated circuit or system on a chip (SOC), such as SOC 101 in FIG. 1B, SOC controller 1241 in FIG. 12. In addition, the control circuitry 22 may include a preamp circuit, such as preamplifier 104 in FIG. 1B and/or preamplifier 1250 in FIG. 12, where the preamp circuit is implemented as a separate integrated circuit, integrated into the read channel or data storage controller circuit, or integrated into an SOC.

In some examples, the control circuitry, such as, but not limited to, control circuitry 22, comprises a microprocessor executing instructions, the instructions being operable to cause the microprocessor to perform the flow diagrams (e.g., shown in FIG. 3) described herein. The instructions may be stored in any computer-readable medium. In some examples, they may be stored on a non-volatile semiconductor memory device, component, or system external to the microprocessor, or integrated with the microprocessor in an SOC. In some examples, the instructions are stored on the disk and read into a volatile semiconductor memory when the disk drive is powered on. In some examples, the control circuitry comprises suitable logic circuitry, such as state machine circuitry. In some examples, at least some of the flow diagram blocks may be implemented using analog circuitry (e.g., analog comparators, timers, etc.), and in other examples at least some of the blocks may be implemented using digital circuitry or a combination of analog and digital circuitry.

In various examples, one or more processing devices may comprise or constitute the control circuitry 22 as described herein, and/or may perform one or more of the functions of control circuitry as described herein. In various examples, the control circuitry 22, or other one or more processing devices performing one or more of the functions of control circuitry as described herein, may be abstracted away from being physically proximate to the disks and disk surfaces. The control circuitry, or other one or more processing devices performing one or more of the functions of control circuitry as described herein, may be part of or proximate to a rack of or a unitary product comprising multiple data storage devices, or may be part of or proximate to one or more physical or virtual servers, or may be part of or proximate to one or more local area networks or one or more storage area networks, or may be part of or proximate to a data center, or may be hosted in one or more cloud services, in various examples.

In various examples, a disk drive, such as disk drive 15, may include a magnetic disk drive, an optical disk drive, a hybrid disk drive, or other types of disk drive. In addition, some examples may include electronic devices such as computing devices, data server devices, media content storage devices, or other devices, components, or systems that may comprise the storage media and/or control circuitry as described above.

The various features and processes described above may be used independently of one another or may be combined in various ways. All possible combinations and subcombinations are intended to fall within the scope of this disclosure. In addition, certain method(s), event(s), or process blocks may be omitted in some implementations. The methods and processes described herein are also not limited to any particular sequence, and the blocks or states relating thereto can be performed in other sequences. For example, described tasks or events may be performed in an order other than that specifically disclosed, or multiple may be combined in a single block or state. The example tasks or events may be performed in serial, in parallel, or in another manner. Tasks or events may be added to or removed from the disclosed examples. The example systems and components described herein may be configured differently than described. For example, elements may be added to, removed from, or rearranged compared to the disclosed examples.

While certain example embodiments are described herein, these embodiments are presented by way of example only, and do not limit the scope of the disclosure. Thus, nothing in the foregoing description implies that any particular feature, characteristic, step, module, or block is necessary or indispensable. The novel methods and systems described herein may be embodied in a variety of other forms. Various omissions, substitutions and changes in the form of the methods and systems described herein may be made without departing from the spirit and scope of the present disclosure.

Method 80 and other methods of this disclosure may include other steps or variations in various other embodiments. Some or all of any of method 80 may be performed by or embodied in hardware, and/or performed or executed by a controller, a CPU, a field-programmable gate array (FPGA), a SOC, a multi-processor system on chip (MP-SOC), which may include both a CPU and an FPGA, and other elements together in one integrated SOC, or other processing device or computing device processing executable instructions, in controlling other associated hardware, devices, systems, or products in executing, implementing, or embodying various subject matter of the method.

Data storage systems, devices, and methods are thus shown and described herein, in various foundational aspects and in various selected illustrative applications, architectures, techniques, and methods for managing laser diode cavity thermal transients for data storage devices, such as HAMR drives, and other aspects of this disclosure. Persons skilled in the relevant fields of art will be well-equipped by this disclosure with an understanding and an informed reduction to practice of a wide panoply of further applications, architectures, techniques, and methods for managing laser diode cavity thermal transients for data storage devices, such as HAMR drives, and other aspects of this disclosure encompassed by the present disclosure and by the claims set forth below.

As used herein, the recitation of "at least one of A, B and C" is intended to mean "either A, B, C or any combination of A, B and C." The descriptions of the disclosed examples are provided to enable any person skilled in the relevant fields of art to understand how to make or use the subject matter of the present disclosure. Various modifications to these embodiments will be readily apparent to those skilled in the art based on the present disclosure, and the generic principles defined herein may be applied to other examples without departing from the spirit or scope of the disclosure. Thus, the present disclosure is not limited to the embodiments shown herein but is to be accorded the widest scope consistent with the principles and novel features disclosed herein.

The present disclosure and many of its attendant advantages will be understood by the foregoing description, and various changes may be made in the form, construction, and arrangement of the components without departing from the disclosed subject matter or without sacrificing all of its material advantages. The form described is merely explanatory, and the following claims encompass and include a wide range of embodiments, including a wide range of examples encompassing any such changes in the form, construction, and arrangement of the components as described herein.

While the present disclosure has been described with reference to various examples, it will be understood that these examples are illustrative and that the scope of the disclosure is not limited to them. All subject matter described herein are presented in the form of illustrative, non-limiting examples, and not as exclusive implementations, whether or not they are explicitly called out as examples as described. Many variations, modifications, and additions are possible within the scope of the examples of the disclosure. More generally, examples in accordance with the present disclosure have been described in the context of particular implementations. Functionality may be separated or combined in blocks differently in various examples of the disclosure or described with different terminology, without departing from the spirit and scope of the present disclosure and the following claims. These and other variations, modifications, additions, and improvements may fall within the scope of the disclosure as defined in the claims that follow.

What is claimed is:

1. A data storage device, comprising:
   one or more disks;
   an actuator arm assembly comprising one or more magnetic recording heads;
   at least one laser diode corresponding to the one or more magnetic recording heads; and
   one or more processing devices configured to:
      initiate a write operation, wherein initiating the write operation comprises:
         activating a magnetic recording head corresponding to the at least one laser diode, and
         applying a forward bias to at the least one laser diode;
      apply a first reverse bias to the at least one laser diode during at least one intervening event, wherein the at least one intervening event comprises an event selected from a group consisting of a track seek event and a servo wedge crossing event; and
      transition from applying the first reverse bias to the at least one laser diode to applying the forward bias to the at least one laser diode.

2. The data storage device of claim 1, wherein the at least one intervening event further comprises a plurality of intervening events, and wherein transitioning to applying the forward bias occurs with continuing the write operation, wherein the continuing the write operation comprises at least one of:
   resuming the write operation after each of the plurality of intervening events; and
   resuming the write operation between adjacent intervening events of the plurality of intervening events.

3. The data storage device of claim 1, wherein each of the at least one laser diode is positioned inside a corresponding laser diode cavity, and wherein applying the first reverse bias to the at least one laser diode during the at least one intervening event comprises:

controlling transition of a preamplifier from applying the forward bias to the at least one laser diode to applying the first reverse bias;

wherein a temperature of a corresponding laser diode cavity is configured to stay the same or substantially the same after controlling the transition from the forward bias to the first reverse bias for the at least one laser diode.

4. The data storage device of claim 1, wherein each of the at least one laser diode is positioned inside a corresponding laser diode cavity, and wherein, when the first reverse bias is applied to the at least one laser diode during the at least one intervening event, the at least one laser diode is in a non-lasing state, no data writing or rewriting occurs, and a temperature of a corresponding laser diode cavity is configured to stay the same or substantially the same after the transition from the first reverse bias to the forward bias for the at least one laser diode.

5. The data storage device of claim 1, further comprising a preamplifier that comprises a reverse bias power control circuit coupled to the at least one laser diode and configured to apply at least one reverse bias, including the first reverse bias, to the at least one laser diode.

6. The data storage device of claim 1, wherein the at least one laser diode dissipates a first power when the forward bias is applied, and wherein the at least one laser diode dissipates a second power when the first reverse bias is applied.

7. The data storage device of claim 6, wherein:

the first power is the same or substantially the same as the second power; or the first power is greater than the second power.

8. The data storage device of claim 1, wherein each of the at least one laser diode is positioned inside a corresponding laser diode cavity, and wherein the one or more processing devices are further configured to:

apply a second reverse bias to the at least one laser diode to preheat a corresponding laser diode cavity to a target temperature prior to initiating the write operation.

9. The data storage device of claim 8, wherein the target temperature corresponds to a steady-state temperature associated with the write operation and when the at least one laser diode is in a lasing state.

10. The data storage device of claim 8, wherein a power dissipated by the at least one laser diode is the same or substantially the same when the first reverse bias, the second reverse bias, and the forward bias is applied.

11. The data storage device of claim 10, wherein applying each of the first reverse bias and the second reverse bias comprises applying a negative voltage, and wherein a value of each of the negative voltages is kept below an avalanche or breakdown voltage for the at least one laser diode.

12. A method of operating a data storage device, the method comprising:

initiating a write operation, wherein initiating the write operation comprises:

activating a magnetic recording head corresponding to at least one laser diode of the data storage device, and applying a forward bias to the at least one laser diode;

applying a first reverse bias to the at least one laser diode during at least one intervening event, wherein the at least one intervening event comprises an event selected from a group consisting of a track seek event and a sector ID crossing event; and transitioning from applying the first reverse bias to the at least one laser diode to applying the forward bias to the at least one laser diode.

13. The method of claim 12, wherein each of the at least one laser diode is positioned inside a corresponding laser diode cavity, and wherein applying the first reverse bias to the at least one laser diode during the at least one intervening event comprises:

controlling transition of a preamplifier from applying the forward bias to the at least one laser diode to applying the first reverse bias;

wherein a temperature of a corresponding laser diode cavity is configured to stay the same or substantially the same after controlling the transition from the forward bias to the first reverse bias for the at least one laser diode.

14. The method of claim 12, wherein each of the at least one laser diode is positioned inside a corresponding laser diode cavity, and wherein, when the first reverse bias is applied to the at least one laser diode during the at least one intervening event:

the at least one laser diode is in a non-lasing state, no data writing or overwriting occurs, and a temperature of a corresponding laser diode cavity is configured to stay the same or substantially the same after the transition from applying the first reverse bias to the forward bias for the at least one laser diode.

15. The method of claim 12, further comprising:

selecting a first power, wherein the first power corresponds to a power dissipated by the at least one laser diode when the forward bias is applied; and selecting a second power, wherein the second power corresponds to a power dissipated by the at least one laser diode when the first reverse bias is applied.

16. The method of claim 15, wherein one of:

the first power is the same or substantially the same as the second power; or the first power is greater than the second power.

17. The method of claim 12, wherein each of the at least one laser diode is positioned inside a corresponding laser diode cavity, the method further comprising:

applying a second reverse bias to the at least one laser diode to preheat a corresponding laser diode cavity to a target temperature prior to initiating the write operation.

18. The method of claim 17, wherein the target temperature comprises a steady-state temperature associated with the write operation and when the at least one laser diode is in a lasing state.

19. The method of claim 17, wherein a power dissipated by the at least one laser diode is the same or substantially the same when the first reverse bias, the second reverse bias, and the forward bias is applied.

20. The method of claim 19, wherein applying each of the first reverse bias and the second reverse bias comprises applying a negative voltage, and wherein a value of each of the negative voltages is kept below an avalanche or breakdown voltage for the at least one laser diode.

21. One or more processing devices comprising:

means for initiating a write operation, wherein the means for initiating the write operation comprises:

means for activating a magnetic recording head corresponding to at least one laser diode of a data storage device, and means for applying a forward bias to the at least one laser diode;

means for applying a first reverse bias to the at least one laser diode during at least one intervening event, wherein the at least one intervening event comprises an event selected from a group consisting of a track seek event and a servo wedge crossing event; and means for transitioning from applying the first reverse bias to the at least one laser diode to applying the forward bias to the at least one laser diode.

22. A data storage device, comprising:

one or more disks;

an actuator arm assembly comprising one or more magnetic recording heads;

a laser diode, wherein the laser diode is positioned inside a laser diode cavity; and one or more processing devices configured to:
    initiate a write operation, wherein initiating the write operation comprises:
        activating a magnetic recording head corresponding to the laser diode, and
        applying a forward bias to the laser diode;
    pause application of the forward bias to the laser diode during an intervening event, wherein the intervening event comprises one of a track seek event and a servo wedge crossing event;
    preheat the laser diode cavity during the intervening event; and
    resume application of the forward bias to the laser diode.

23. The data storage device of claim 22, wherein preheating the laser diode cavity during the intervening event comprises:

generating a first reverse bias; and controlling transition of a preamplifier from applying the forward bias to the laser diode to applying the first reverse bias.

24. The data storage device of claim 23, wherein resuming application of the forward bias occurs with continuing the write operation, and wherein resuming application of the forward bias to the laser diode comprises:

controlling transition of the preamplifier from applying the first reverse bias to the laser diode to applying the forward bias to the laser diode;

wherein a temperature of the laser diode cavity is configured to stay the same or substantially the same after controlling the transition from applying the forward bias to applying the first reverse bias for the laser diode.

25. The data storage device of claim 22, further comprising a heater for preheating the laser diode cavity during the intervening event, and wherein a temperature of the laser diode cavity is configured to stay the same or substantially the same prior to, during, and after the intervening event.

26. A data storage device, comprising:

one or more disks;

an actuator arm assembly comprising one or more magnetic recording heads;

at least one laser diode corresponding to the one or more magnetic recording heads, wherein each of the at least one laser diode is positioned inside a corresponding laser diode cavity; and one or more processing devices configured to:
    initiate a write operation, wherein initiating the write operation comprises:
        activating a magnetic recording head corresponding to the at least one laser diode, and
        applying a forward bias to at the least one laser diode;
    apply a first reverse bias to the at least one laser diode during at least one intervening event, wherein applying the first reverse bias during the at least one intervening event comprises controlling transition of a preamplifier from applying the forward bias to applying the first reverse bias to the at least one laser diode, and wherein a temperature of a corresponding laser diode cavity is configured to stay the same or substantially the same after controlling the transition from the forward bias to the first reverse bias for the at least one laser diode; and
    transition from applying the first reverse bias to the at least one laser diode to applying the forward bias to the at least one laser diode.

\* \* \* \* \*